(12) United States Patent
Uchida et al.

(10) Patent No.: US 9,773,924 B2
(45) Date of Patent: Sep. 26, 2017

(54) SEMICONDUCTOR DEVICE HAVING BARRIER REGION AND EDGE TERMINATION REGION ENCLOSING BARRIER REGION

(71) Applicant: Panasonic Intellectual Property Management Co., Ltd., Osaka (JP)

(72) Inventors: Masao Uchida, Osaka (JP); Kouichi Saitou, Toyama (JP); Takayuki Wakayama, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/089,542

(22) Filed: Apr. 2, 2016

(65) Prior Publication Data
US 2016/0315203 A1 Oct. 27, 2016

(30) Foreign Application Priority Data
Apr. 22, 2015 (JP) .................................. 2015-087488

(51) Int. Cl.
*H01L 29/872* (2006.01)
*H01L 29/16* (2006.01)
(Continued)

(52) U.S. Cl.
CPC .......... *H01L 29/872* (2013.01); *H01L 29/045* (2013.01); *H01L 29/0619* (2013.01);
(Continued)

(58) Field of Classification Search
CPC .. H01L 29/872; H01L 29/045; H01L 29/0619
See application file for complete search history.

(56) References Cited

U.S. PATENT DOCUMENTS

| 6,384,428 | B1 | 5/2002 | Oono et al. |
| 2008/0169475 | A1* | 7/2008 | Nishio .................. H01L 29/872 |
| | | | 257/77 |

(Continued)

FOREIGN PATENT DOCUMENTS

| JP | 2002-314099 | 10/2002 |
| JP | 2007-184327 | 7/2007 |

(Continued)

*Primary Examiner* — Matthew Reames
(74) *Attorney, Agent, or Firm* — McDermott Will & Emery LLP

(57) ABSTRACT

A semiconductor device according to an aspect of the present disclosure includes a semiconductor substrate having a first conductivity type and having a principal surface and a back surface, a silicon carbide semiconductor layer having the first conductivity type and disposed on the principal surface, barrier regions having a second conductivity type and disposed within the silicon carbide semiconductor layer, an edge termination region having the second conductivity type and disposed within the silicon carbide semiconductor layer, the edge termination region enclosing the barrier regions, a first electrode disposed on the silicon carbide semiconductor layer, and a second electrode disposed on the back surface, wherein each of the barrier regions has a polygonal boundary with the silicon carbide semiconductor layer, and each of sides of the polygonal boundary has an angle of 0° to 5° inclusive relative to <11-20> direction of crystal orientations of the semiconductor substrate.

20 Claims, 24 Drawing Sheets

(51) Int. Cl.
    *H01L 29/04*    (2006.01)
    *H01L 29/66*    (2006.01)
    *H01L 29/06*    (2006.01)
    *H01L 29/36*    (2006.01)
    *H01L 29/40*    (2006.01)

(52) U.S. Cl.
    CPC ...... *H01L 29/0692* (2013.01); *H01L 29/1608* (2013.01); *H01L 29/6606* (2013.01); *H01L 29/36* (2013.01); *H01L 29/402* (2013.01)

(56) References Cited

U.S. PATENT DOCUMENTS

2008/0277668 A1* 11/2008 Okuno ................ H01L 29/0692
                                                                257/77
2012/0056197 A1    3/2012  Mizukami et al.
2013/0214291 A1    8/2013  Uchida et al.
2015/0206941 A1    7/2015  Uehigashi et al.

FOREIGN PATENT DOCUMENTS

| | | |
|---|---|---|
| JP | 2012-059870 | 3/2012 |
| JP | 2012-156154 | 8/2012 |
| JP | 2012-231019 | 11/2012 |
| JP | 2014-060276 | 4/2014 |
| WO | 99/48153 | 9/1999 |
| WO | 2012/056705 | 5/2012 |

* cited by examiner

SEMICONDUCTOR DEVICE HAVING BARRIER REGION AND EDGE TERMINATION REGION ENCLOSING BARRIER REGION

BACKGROUND

1. Technical Field

The present disclosure relates to semiconductor devices and methods for manufacturing the same. In particular, the present disclosure relates to semiconductor devices including silicon carbide, and to methods for manufacturing the same.

2. Description of the Related Art

Silicon carbide (SiC) is a semiconductor material having a larger bandgap and a higher hardness than silicon (Si). For example, SiC is used in power devices such as switching devices and rectifying devices. SiC power devices have advantages over Si power devices such as low power loss.

Some typical semiconductor devices using SiC are metal-insulator-semiconductor field-effect transistors (MISFETs) and Schottky-barrier diodes (SBDs). Metal-oxide-semiconductor field-effect transistors (MOSFETs) are a type of MISFETs, and junction-barrier Schottky diodes (JBSs) are a type of SBDs.

A JBS includes a first conductivity type semiconductor layer, a plurality of second conductivity type regions disposed in contact with the first conductivity type semiconductor layer, and a Schottky electrode forming a Schottky junction with the first conductivity type semiconductor layer. Because of having a plurality of second conductivity type regions, the JBS achieves a reduction in leakage current when reverse-biased as compared to an SBD (see, for example, Japanese Unexamined Patent Application Publication No. 2014-60276).

SUMMARY

In one general aspect, the techniques disclosed here feature a semiconductor device including a semiconductor substrate having a first conductivity type and having a principal surface and a back surface, a silicon carbide semiconductor layer having the first conductivity type and disposed on the principal surface of the semiconductor substrate, barrier regions having a second conductivity type and disposed within the silicon carbide semiconductor layer, an edge termination region having the second conductivity type and disposed within the silicon carbide semiconductor layer, the edge termination region enclosing the barrier regions as viewed in a direction normal to the principal surface, a first electrode disposed on the silicon carbide semiconductor layer and forming a Schottky junction with the silicon carbide semiconductor layer, and a second electrode disposed on the back surface of the semiconductor substrate and forming an ohmic junction with the semiconductor substrate; wherein the first electrode has a surface in contact with the silicon carbide semiconductor layer, the first electrode is in contact with the edge termination region along an edge portion of the surface of the first electrode in contact with the silicon carbide semiconductor layer, each of the barrier regions has a polygonal boundary with the silicon carbide semiconductor layer as viewed in the direction normal to the principal surface, each of sides of the polygonal boundary has an angle of 0° to 5° inclusive relative to <11-20> direction of crystal orientations of the semiconductor substrate, the barrier regions are arranged periodically as viewed in the direction normal to the principal surface, and at least two of the barrier regions are separated from each other in the <11-20> direction of the crystal orientations of the semiconductor substrate.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
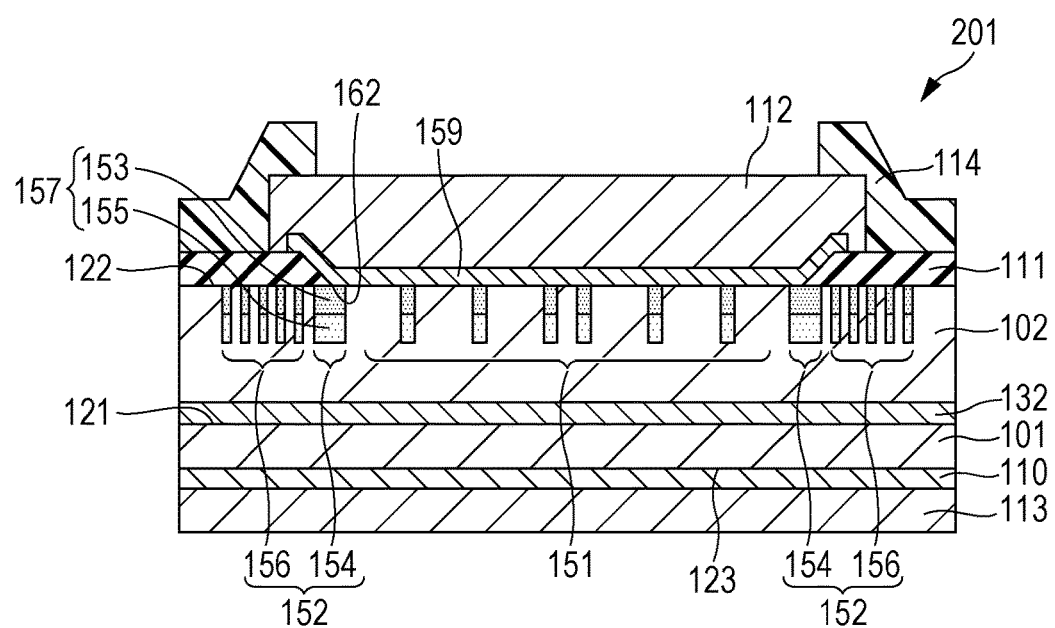
FIG. 1 is a sectional view schematically illustrating a semiconductor device according to a first embodiment of the present disclosure.

Aspects of the present disclosure reside in the following items,

[Item 1]

A semiconductor device including a semiconductor substrate having a first conductivity type and having a principal surface and a back surface, a silicon carbide semiconductor layer having the first conductivity type and disposed on the principal surface of the semiconductor substrate, barrier regions having a second conductivity type and disposed within the silicon carbide semiconductor layer, an edge termination region having the second conductivity type and disposed within the silicon carbide semiconductor layer, the edge termination region enclosing the barrier regions as viewed in a direction normal to the principal surface, a first electrode disposed on the silicon carbide semiconductor layer and forming a Schottky junction with the silicon carbide semiconductor layer, and a second electrode disposed on the back surface of the semiconductor substrate and forming an ohmic junction with the semiconductor substrate; wherein the first electrode has a surface in contact with the silicon carbide semiconductor layer, the first electrode is in contact with the edge termination region along an edge portion of the surface of the first electrode in contact with the silicon carbide semiconductor layer, each of the barrier regions has a polygonal boundary with the silicon carbide semiconductor layer as viewed in the direction normal to the principal surface, each of sides of the polygonal boundary has an angle of 0° to 5° inclusive relative to <11-20> direction of crystal orientations of the semiconductor substrate, the barrier regions are arranged periodically as viewed in the direction normal to the principal surface, and at least two of the barrier regions are separated from each other in the <11-20> direction of the crystal orientations of the semiconductor substrate.

With this configuration, the semiconductor device achieves a higher breakdown voltage than when the boundaries between the barrier region and the silicon carbide semiconductor layer include sides parallel to <1-100> direction of the crystal orientations of the semiconductor substrate. Further, the portion of the silicon carbide semiconductor layer that is enclosed by the edge termination region has an increased area of the barrier-free sections as compared to when the barrier regions have no separation in <11-20> direction, and it is therefore possible to increase the forward current in the semiconductor device and to reduce the forward on-state voltage of the semiconductor device.

In the semiconductor device according to one aspect of the present disclosure, the polygonal boundary may have a rounded corner.

[Item 2]

The semiconductor device described in Item 1, wherein the polygonal boundary has an inner angle of 60° or 120°.

With this configuration, all the sides of the boundaries between the barrier region and the silicon carbide semiconductor layer extend in a direction equivalent to <11-20> direction, and consequently the breakdown voltage of the semiconductor device can be enhanced as compared to when the boundaries include sides parallel to <1-100> direction of the crystal orientations of the semiconductor substrate.

[Item 3]

The semiconductor device described in Item 1 or 2, wherein the polygonal boundary is parallelogrammatic or hexagonal.

With this configuration, the portion of the silicon carbide semiconductor layer that is enclosed by the edge termination region has an increased area of the barrier-free sections, and it is therefore possible to increase the forward current in the semiconductor device and to reduce the forward on-state voltage of the semiconductor device.

[Item 4]

The semiconductor device described in any of Items 1 to 3, wherein the edge termination region and the barrier regions each include a pair of a high-concentration region disposed in contact with a surface of the silicon carbide semiconductor layer and a low-concentration region disposed between the semiconductor substrate and the high-concentration region; the high-concentration regions and the low-concentration regions each include a second conductivity type impurity; and an impurity concentration in the high-concentration regions is higher than an impurity concentration in the low-concentration regions.

With this configuration, a further enhancement in the breakdown voltage of the semiconductor device can be obtained.

[Item 5]

The semiconductor device described in Item 4, wherein each pair of the high-concentration region and the low-concentration region have an identical outline as viewed in the direction normal to the principal surface.

With this configuration, the high-concentration region and the low-concentration region can be formed at the same time, and consequently the production process can be simplified.

[Item 6]

The semiconductor device described in any of Items 1 to 5, wherein the edge termination region includes a guard ring subregion having the second conductivity type and disposed in contact with the first electrode, and a floating subregion having the second conductivity type and disposed out of contact with the guard ring subregion, the floating subregion enclosing the guard ring subregion as viewed in the direction normal to the principal surface.

With this configuration, the breakdown voltage of the semiconductor device can be controlled to a high breakdown voltage of, for example, 900 V or above by changing the number of the floating subregions.

[Item 7]

The semiconductor device described in Item 4 or 5, wherein the impurity concentration in a direction of depth of the low-concentration regions has a profile including an upward curve.

With this configuration, crystal defects occurring in the pn junctions between the silicon carbide semiconductor layer, and the edge termination region and barrier regions have a relatively small size, and consequently the leakage current from the pn junctions can be reduced.

[Item 8]

The semiconductor device described in Item 7, wherein the impurity concentration in the high-concentration regions is not less than $1 \times 10^{19}$ cm$^{-3}$ and the impurity concentration in the low-concentration regions is less than $1 \times 10^{19}$ cm$^{-3}$.

With this configuration, the electric field concentration in the edge termination region is further reduced, and the semiconductor device achieves a higher breakdown voltage.

[Item 9]

The semiconductor device described in Item 7, wherein the impurity concentration in the high-concentration regions is not less than $1 \times 10^{20}$ cm$^{-3}$ and the impurity concentration in the low-concentration regions is less than $1 \times 10^{20}$ cm$^{-3}$.

With this configuration, the electric field concentration in the edge termination region is still further reduced, and the semiconductor device achieves a still higher breakdown voltage,

[Item 10]

The semiconductor device described in any of Items 1 to 9, wherein the first electrode includes a metal selected from the group consisting of Ti, Ni and Mo.

With this configuration, the first electrode can easily form a Schottky junction with the silicon carbide semiconductor layer.

[Item 11]

A semiconductor device including a semiconductor substrate having a first conductivity type and having a principal surface and a back surface, a silicon carbide semiconductor layer having the first conductivity type and disposed on the principal surface of the semiconductor substrate, a barrier region having a second conductivity type and disposed within the silicon carbide semiconductor layer, an edge termination region having the second conductivity type and disposed within the silicon carbide semiconductor layer, the edge termination region enclosing the barrier region as viewed in a direction normal to the principal surface, a first electrode disposed on the silicon carbide semiconductor layer and forming a Schottky junction with the silicon carbide semiconductor layer, and a second electrode disposed on the back surface of the semiconductor substrate and forming an ohmic junction with the semiconductor substrate, wherein the first electrode has a surface in contact with the silicon carbide semiconductor layer, the first electrode is in contact with the edge termination region along an edge portion of the surface of the first electrode in contact with the silicon carbide semiconductor layer, the barrier region has a polygonal boundary with the silicon carbide semiconductor layer as viewed in the direction normal to the principal surface, each of sides of the polygonal boundary has an angle of 0° to 5° inclusive relative to <11-20> direction of crystal orientations of the semiconductor substrate, the barrier region encloses a portion of a surface of the silicon carbide semiconductor layer as viewed in the direction normal to the principal surface.

With this configuration, the semiconductor device achieves a higher breakdown voltage than when the boundaries between the barrier region and the silicon carbide semiconductor layer include sides parallel to <1-100> direction of the crystal orientations of the semiconductor substrate.

In the semiconductor device according to one aspect of the present disclosure, the polygonal boundary may have a rounded corner.

[Item 12]

The semiconductor device described in Item 11, wherein the polygonal boundary has an inner angle of 60° or 120°.

With this configuration, all the sides of the boundaries between the barrier region and the silicon carbide semiconductor layer extend in a direction equivalent to <11-20> direction, and consequently the breakdown voltage of the semiconductor device can be enhanced as compared to when the boundaries include sides parallel to <1-100> direction of the crystal orientations of the semiconductor substrate.

[Item 13]

The semiconductor device described in Item 11 or 12, wherein the polygonal boundary is parallelogrammatic or hexagonal.

With this configuration, the portion of the silicon carbide semiconductor layer that is enclosed by the edge termination region has an increased area of the barrier-free sections, and it is therefore possible to increase the forward current in the semiconductor device and to reduce the forward on-state voltage of the semiconductor device.

[Item 14]

The semiconductor device described in any of Items 11 to 13, wherein the edge termination region and the barrier region each include a pair of a high-concentration region disposed in contact with the surface of the silicon carbide semiconductor layer and a low-concentration region disposed between the semiconductor substrate and the high-concentration region, the high-concentration regions and the low-concentration regions each include a second conductivity type impurity, and an impurity concentration in the high-concentration regions is higher than an impurity concentration in the low-concentration regions.

With this configuration, a further enhancement in the breakdown voltage of the semiconductor device can be obtained.

[Item 15]

The semiconductor device described in Item 14, wherein each pair of the high-concentration region and the low-concentration region have an identical outline as viewed in the direction normal to the principal surface.

With this configuration, the high-concentration region and the low-concentration region can be formed at the same time, and consequently the production process can be simplified.

[Item 16]

The semiconductor device described in any of Items 11 to 15, wherein the edge termination region includes a guard ring subregion having the second conductivity type and disposed in contact with the first electrode, and a floating subregion having the second conductivity type and disposed out of contact with the guard ring subregion, the floating subregion enclosing the guard ring subregion as viewed in the direction normal to the principal surface.

With this configuration, the breakdown voltage of the semiconductor device can be controlled to a high breakdown voltage of, for example, 900 V or above by changing the number of the floating subregions.

[Item 17]

The semiconductor device described in Item 14 or 15, wherein the impurity concentration in a direction of depth of the low-concentration regions has a profile including an upward curve.

With this configuration, crystal defects occurring in the pn junctions between the silicon carbide semiconductor layer, and the edge termination region and barrier region have a relatively small size, and consequently the leakage current from the pn junctions can be reduced.

[Item 18]

The semiconductor device described in Item 17, wherein the impurity concentration in the high-concentration regions is not less than $1 \times 10^{19}$ cm$^{-3}$ and the impurity concentration in the low-concentration regions is less than $1 \times 10^{19}$ cm$^{-3}$.

With this configuration, the electric field concentration in the edge termination region is further reduced, and the semiconductor device achieves a higher breakdown voltage.

[Item 19]

The semiconductor device described in Item 17, wherein the impurity concentration in the high-concentration regions is not less than $1 \times 10^{20}$ cm$^{-3}$ and the impurity concentration in the low-concentration regions is less than $1 \times 10^{20}$ cm$^{-3}$.

With this configuration, the electric field concentration in the edge termination region is still further reduced, and the semiconductor device achieves a still higher breakdown voltage.

[Item 20]

The semiconductor device described in any of Items 11 to 19, wherein the first electrode includes a metal selected from the group consisting of Ti, Ni and Mo.

With this configuration, the first electrode can easily form a Schottky junction with the silicon carbide semiconductor layer.

[Item 21]

A semiconductor device manufacturing method including providing a first conductivity type semiconductor substrate having a principal surface and a back surface; forming a first conductivity type silicon carbide semiconductor layer onto the principal surface of the semiconductor substrate; forming a second conductivity type edge termination region within the silicon carbide semiconductor layer; forming a plurality of second conductivity type barrier regions within the silicon carbide semiconductor layer; forming a second electrode onto the back surface of the semiconductor substrate in ohmic contact with the semiconductor substrate; and forming a first electrode onto the silicon carbide semiconductor layer in Schottky contact with the silicon carbide semiconductor layer; the edge termination region being formed so as to enclose the plurality of barrier regions as viewed in a direction normal to the principal surface; each of the plurality of barrier regions having a polygonal boundary with the silicon carbide semiconductor layer as viewed in the direction normal to the principal surface; each of the sides of the polygonal boundary having an angle of 0° to 5° inclusive relative to <11-20> direction of crystal orientations of the semiconductor substrate; the plurality of barrier regions being arranged periodically as viewed in the direction normal to the principal surface; at least two of the plurality of barrier regions being separated from each other in <11-20> direction of the crystal orientations of the semiconductor substrate.

By this method, a semiconductor device can be manufactured which achieves a higher breakdown voltage than when the boundaries between the barrier region and the silicon carbide semiconductor layer include sides parallel to <1-100> direction of the crystal orientations of the semiconductor substrate. Further, because the portion of the silicon carbide semiconductor layer that is enclosed by the edge termination region has an increased area of the barrier-free sections as compared to when the barrier regions have no separation in <11-20> direction, it is possible to produce a semiconductor device having an increased forward current and a reduced forward on-state voltage.

[Item 22]

A semiconductor device manufacturing method including providing a first conductivity type semiconductor substrate having a principal surface and a back surface; forming a first conductivity type silicon carbide semiconductor layer onto the principal surface of the semiconductor substrate; forming a second conductivity type edge termination region within the silicon carbide semiconductor layer; forming a second conductivity type barrier region within the silicon carbide semiconductor layer; forming a second electrode onto the back surface of the semiconductor substrate in ohmic contact with the semiconductor substrate; and forming a first electrode onto the silicon carbide semiconductor layer in Schottky contact with the silicon carbide semiconductor layer; the edge termination region being formed so as to enclose the barrier region as viewed in a direction normal to the principal surface; the barrier region having a polygonal boundary with the silicon carbide semiconductor layer as viewed in the direction normal to the principal surface; each of the sides of the polygonal boundary having an angle of 0° to 5° inclusive relative to <11-20> direction of crystal orientations of the semiconductor substrate; the barrier region being formed so as to enclose a portion of the surface of the silicon carbide semiconductor layer as viewed in the direction normal to the principal surface.

By this method, a semiconductor device can be manufactured which achieves a higher breakdown voltage than when the boundaries between the barrier region and the silicon carbide semiconductor layer include sides parallel to <1-100> direction of the crystal orientations of the semiconductor substrate. Further, because the portion of the silicon carbide semiconductor layer that is enclosed by the edge termination region has an increased area of the section occupied by the barrier region as compared to when the configuration is inverted, it is possible to produce a semiconductor device having a reduced amount of leakage current in the reverse direction,

[Item 23]

The semiconductor device manufacturing method described in Item 21 or 22, wherein the edge termination region and the plurality of barrier regions or the barrier region are formed at the same time, This configuration allows the semiconductor device manufacturing process to be simplified.

(First Embodiment)

Hereinbelow, the first embodiment of the present disclosure will be described with reference to the drawings. While the first embodiment illustrates the first conductivity type as being n-type and the second conductivity type as p-type, the conductivity types in the first embodiment are not limited thereto and the first conductivity type may be p-type and the second conductivity type may be n-type.

(Structure of Semiconductor Devices)

A semiconductor device 201 according to the first embodiment of the present disclosure will be described with reference to FIGS. 1 to 11. FIG. 1 is a sectional view schematically illustrating the semiconductor device 201 according to the present embodiment. The semiconductor device 201 includes a semiconductor substrate 101 a silicon carbide semiconductor layer 102, a plurality of barrier regions 151, an edge termination region 152, a first electrode 159 and a second electrode 110.

The semiconductor substrate 101 is a first conductivity type silicon carbide semiconductor substrate. The semiconductor substrate 101 has a principal surface 121 and a back surface 123.

Figure 2:
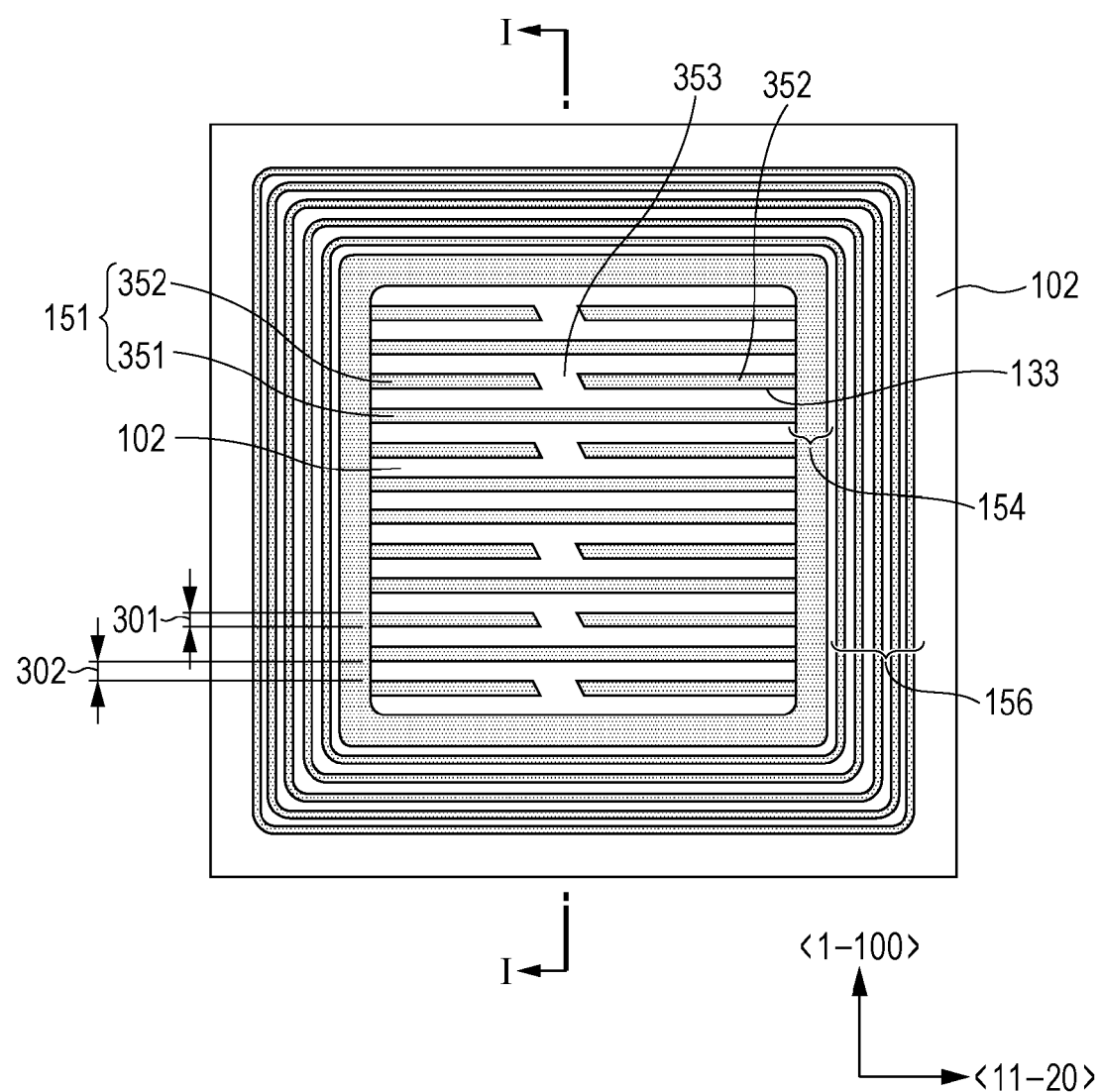
FIG. 2 is a plan view schematically illustrating a silicon carbide layer in the semiconductor device according to the first embodiment as viewed from above.

The silicon carbide semiconductor layer 102 has the first conductivity type and is disposed on the principal surface 121 of the semiconductor substrate 101. The semiconductor device 201 may include a buffer layer 132 between the semiconductor substrate 101 and the silicon carbide semiconductor layer 102. The silicon carbide semiconductor layer 102 has a surface 122 opposite to the semiconductor substrate 101. FIG. 2 is a plan view of the surface 122 of the silicon carbide semiconductor layer 102 as viewed in the direction normal to the principal surface 121 of the semiconductor substrate 101. The sectional view in FIG. 1 shows a cross section taken along line I-I in FIG. 2.

The plurality of barrier regions 151 are disposed within the silicon carbide semiconductor layer 102. As illustrated in FIGS. 1 and 2, the plurality of barrier regions 151 are exposed on portions of the surface 122 of the silicon carbide semiconductor layer 102, and extend from the surface 122 toward the inside of the silicon carbide semiconductor layer 102. In the present embodiment, the barrier regions 151 have a stripe shape on the surface 122. The barrier regions 151 will be described in detail later.

The edge termination region 152 is disposed within the silicon carbide semiconductor layer 102. As illustrated in FIGS. 1 and 2, the edge termination region 152 encloses the plurality of barrier regions 151 as viewed in the direction normal to the principal surface 121 of the semiconductor substrate 101, The edge termination region 152 includes a guard ring subregion 154 enclosing the barrier regions 151 on the surface 122, and an FLR (field limiting ring) subregion 156 that is a floating subregion enclosing the guard ring subregion 154. In the present embodiment, the semiconductor device 201 includes four FLR subregions 156. The four FLR subregions 156 enclose the barrier regions 151 at different distances from the center of the surface 122.

The barrier regions 151, the guard ring subregion 154 and the FLR subregions 156 each contain a second conductivity type impurity. Specifically, the barrier regions 151, the guard ring subregion 154 and the FLR subregions 156 each include a high-concentration region 153 disposed in contact with the surface 122 of the silicon carbide semiconductor layer 102 and containing a second conductivity type impurity, and a low-concentration region 155 disposed nearer to the semiconductor substrate 101 than is the high-concentration region 153 and containing the second conductivity type impurity in a concentration lower than the impurity concentration in the high-concentration region 153. As illustrated in FIGS. 1 and 2, each pair of the high-concentration region 153 and the low-concentration region 155 have an identical outline as viewed in the direction normal to the principal surface 121 of the semiconductor substrate 101. The guard ring subregion 154 and the FLR subregions 156 are separated from each other and are out of contact with each other.

The first electrode 159 is disposed on the surface 122 of the silicon carbide semiconductor layer 102, and forms a Schottky junction with the silicon carbide semiconductor layer 102. Further, the first electrode 159 has an edge 162 that defines the outer periphery of the electrode surface in contact with the surface 122. The edge 162 of the first electrode 159 is in contact with the guard ring subregion 154 of the edge termination region 152 on the surface 122.

An insulating layer 111 is disposed on the portion of the surface 122 of the silicon carbide semiconductor layer 102 that is out of contact with the first electrode 159. That is, the insulating layer 111 covers the FLR subregions 156 and a portion of the guard ring subregion 154 on the surface 122.

An upper electrode 112 is disposed on the first electrode 159. The side surface of the upper electrode 112 is disposed on the insulating layer 111. The upper electrode 112 covers the upper surface and the side surface of the first electrode 159.

A passivation layer 114 is disposed on a portion of the insulating layer 111 and a portion of the upper electrode 112. The passivation layer 114 covers the side surface and a portion of the upper surface of the upper electrode 112.

The second electrode 110 is disposed on the back surface 123 of the semiconductor substrate 101, and forms an ohmic junction with the semiconductor substrate. Further, a backside electrode 113 is disposed on the surface of the second electrode 110 opposite to the semiconductor substrate 101.

Next, the barrier regions 151 and the edge termination region 152 will be described in detail with reference to FIG. 2. As mentioned above, the barrier regions 151 have a stripe shape on the surface 122 of the silicon carbide semiconductor layer 102. More specifically, the plurality of barrier regions 151 include a plurality of first barrier regions 351 and a plurality of second barrier regions 352. Each of the first barrier regions 351 is a continuous stripe. Each of the second barrier regions 352 consists of at least two segments of one stripe divided in the direction in which the stripe extends. That is, the at least two segments of each of the plurality of second barrier regions 352 are separated in the direction in which the stripe extends. In the example illustrated in FIG. 2, the second barrier region 352 is divided by a region 353.

In the example illustrated in FIG. 2, the plurality of first barrier regions 351 and the plurality of second barrier regions 352 are arranged alternately and periodically in the direction perpendicular to the direction in which the stripes extend. For example, the width 301 of the barrier region 151 is 2 µm, and the spacing 302 is 4 µm.

For example, the principal surface 121 of the semiconductor substrate 101 is (0001) Si face of 4H-SiC. In the case of a commercial semiconductor substrate 101, the principal surface 121 may be offcut toward <11-20> direction or <1-100> direction. As indicated in the drawing, FIG. 2 assumes that the direction extending to the right of the paper sheet is <11-20> direction, and the direction extending to the top of the paper sheet is <1-100> direction. The hyphen "-" in these directions indicates a "bar" on the figure that follows the hyphen in the Miller index. Each of these directions includes equivalent directions. For example, <11-20> direction includes [11-20], [-12-10], [-2110], [-1-120], [1-210] and [2-1-10].

Boundaries 133 on the surface 122 between the barrier region 151 and the silicon carbide semiconductor layer 102 are parallel to <11-20> direction. Here, the term "parallel" means that the angle formed between any side of the boundary 133 and <11-20> direction is within ±5°. The edge termination region 152 has a square shape, and the sides thereof are parallel to <11-20> direction or to <1-100> direction.

Figure 29:
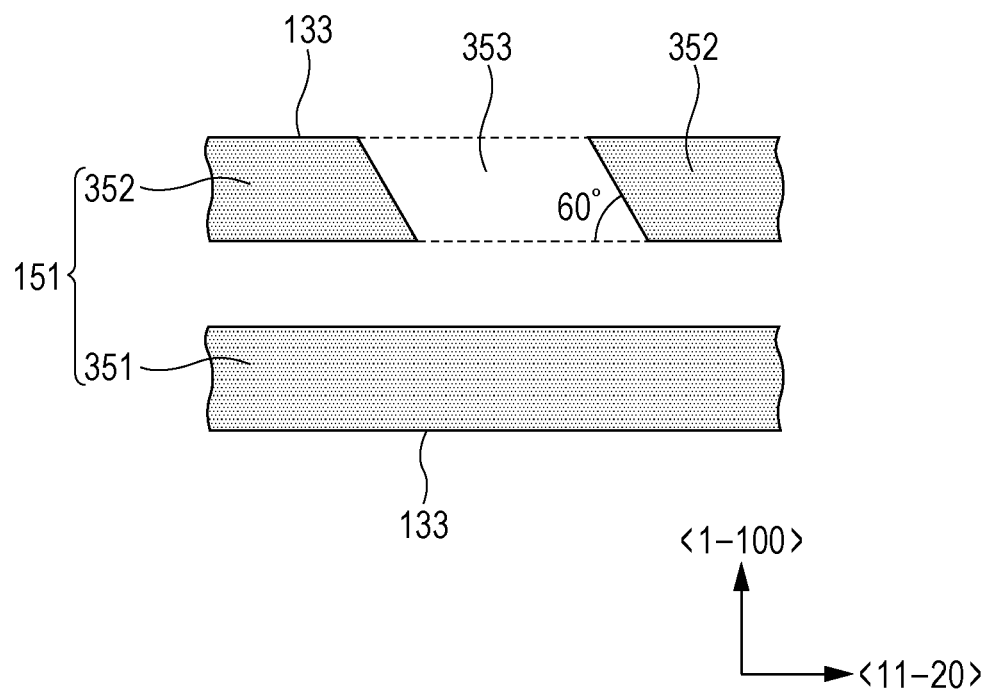
FIG. 29 is an enlarged plan view illustrating part of the barrier regions in the semiconductor device according to the first embodiment of the present disclosure.

FIG. 29 is an enlarged plan view illustrating part of the barrier regions 151 on the surface 122 of the silicon carbide semiconductor layer 102. As mentioned above, the first barrier region 351 is a continuous stripe. The boundary 133 between the first barrier region 351 and the silicon carbide semiconductor layer 102 is parallel to <11-20> direction. The second barrier region 352 includes two segments of one stripe divided by the region 353. The two segments of the second barrier region 352 are separated from each other in <11-20> direction. As illustrated in FIG. 29, the boundary 133 on the surface 122 between the first barrier region 351 and the silicon carbide semiconductor layer 102 is composed solely of lines parallel to the direction in which the stripe extends. On the other hand, the boundary 133 on the surface 122 between the second barrier region 352 and the silicon carbide semiconductor layer 102 forms an angle of 60° in the region 353 relative to the direction in which the stripe extends. As will be described in detail in modified examples later, the silicon carbide semiconductor belongs to the hexagonal system and therefore the directions having an angle of 60° or 120° relative to the direction in which the stripe extends are equivalent to the direction of the extension of the stripe. Thus, the boundary 133 on the surface 122 between the second barrier region 352 and the silicon carbide semiconductor layer 102 is also composed solely of lines parallel to <11-20> direction.

(Operations of Semiconductor Devices)

Reverse-biasing a metal-semiconductor Schottky junction or a semiconductor pn junction causes the depletion layer at the Schottky junction or the pn junction to extend. When the reverse-basing voltage is increased and the field intensity at the junction interface reaches a threshold, an avalanche current flows in the depletion layer and it becomes impossible to further increase the reverse bias. In the present disclosure, the voltage which causes the avalanche current to flow is simply referred to as the breakdown voltage.

The description hereinbelow assumes that the first conductivity type is n-type and the second conductivity type is p-type. The semiconductor device 201 in the first embodiment of the present disclosure has a JBS structure. When a negative voltage is applied to the first electrode 159 relative to the second electrode 110, a depletion layer formed between the first electrode 159 and the n-type silicon carbide semiconductor layer 102 extends toward the n-type semiconductor substrate 101. Further, a pn junction is formed between the p-type barrier region 151 and the n-type silicon carbide semiconductor layer 102, and the biasing causes the depletion layer at the pn junction to extend mainly toward the silicon carbide semiconductor layer 102. The depletion layers extending from the pn junctions of the adjacent barrier regions 151 interrupt the leakage current from the Schottky junctions present between the adjacent barrier regions 151, and consequently the leakage current in the semiconductor device 201 is reduced. The breakdown voltage is exceeded when the field intensity at a junction interface of a Schottky junction or a pn junction reaches a threshold. The edge termination region 152 is provided in order to reduce the field intensity on the surface 122 of the silicon carbide semiconductor layer 102.

Figure 3:
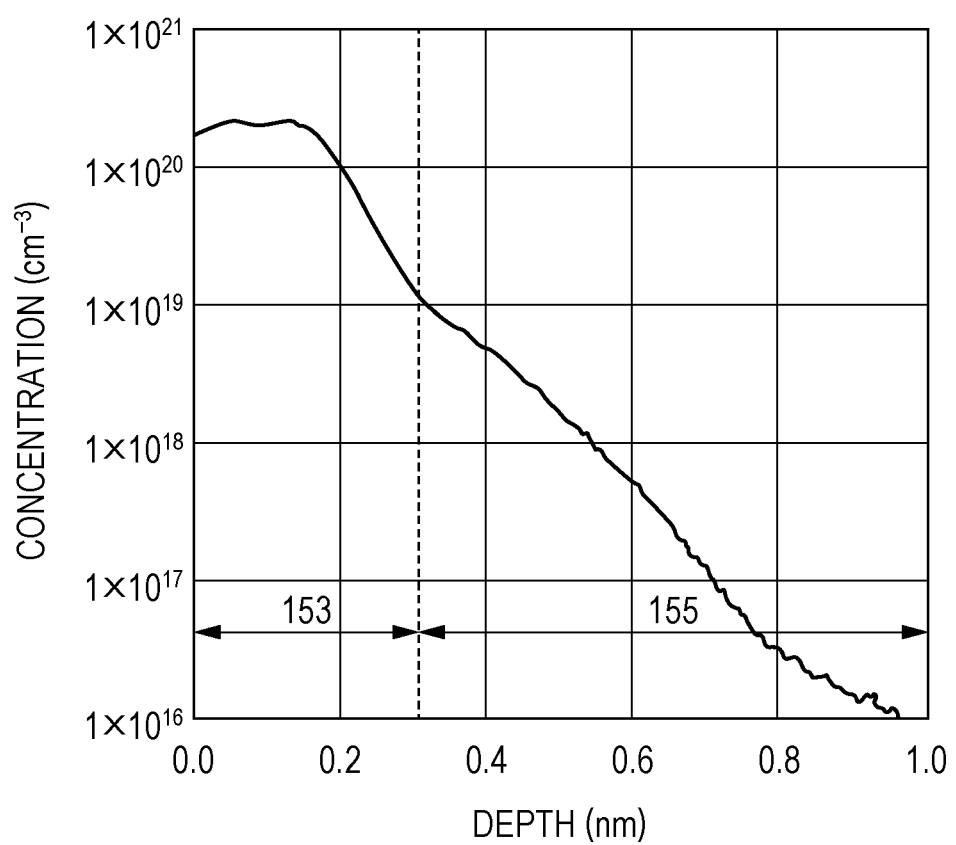
FIG. 3 is a diagram illustrating a concentration profile in the direction of depth in an edge termination region and barrier regions of the semiconductor device according to the first embodiment of the present disclosure.

For the purposes of simplifying the process and thereby saving the production costs, the semiconductor device 201 in the first embodiment of the present disclosure has a structure that allows the edge termination region 152 and the barrier regions 151 to be formed at the same time. The edge termination region 152 and the barrier regions 151 are formed by implanting ions, for example, Al ions into the silicon carbide semiconductor layer 102. The edge termination region 152 and the barrier regions 151 are formed at the same time so as to include the high-concentration regions 153 and the low-concentration regions 155 by implanting Al ions a plurality of times using different magnitudes of implantation energy. FIG. 3 illustrates an exemplary profile of the impurity concentration in the direction of depth. The high-concentration regions 153 and the low-concentration regions 155 in the edge termination region 152 and the barrier regions 151 are collectively written as implanted regions 157. In the example illustrated in FIG. 3, the implanted regions 157 are formed using four levels of implantation energy. As illustrated in FIG. 3, the high-concentration regions 153 may be defined as regions that extend from the surface 122 of the silicon carbide semiconductor layer 102 to the border of the low-concentration regions 155, namely, regions that contain a second conductivity type impurity in a concentration not less than the prescribed concentration, and the low-concentration regions 155 may be defined as regions that contain the second conductivity type impurity in a concentration less than the prescribed concentration. The concentration profile of the low-concentration regions 155 may include an upward curve when the concentration is represented on the ordinate on the log scale and the depth is represented on the abscissa on the linear scale. The upward curve in the concentration profile includes not only a peak and a sub peak, but also a shoulder. The shoulder is a segment in which the slope of the profile, specifically, the rate of the decrease in concentration becomes slow as the depth is increased. For example, the prescribed concentration is $1 \times 10^{19}$ cm$^{-3}$ or $1 \times 10^{20}$ cm$^{-3}$.

When, for example, the prescribed concentration is $1 \times 10^{19}$ cm$^{-3}$, the high-concentration regions 153 in the profile illustrated in FIG. 3 are regions extending from the surface to a depth of about 0.3 μm, and the low-concentration regions 155 are regions at greater depths than the high-concentration regions 153.

Figure 27:
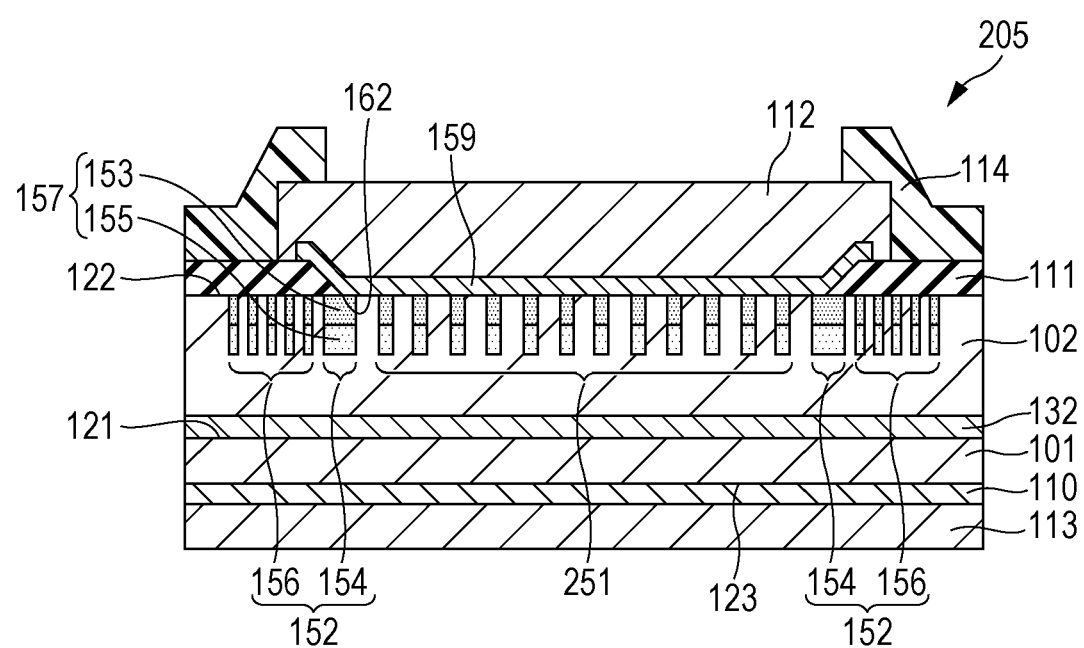
FIG. 27 is a sectional view schematically illustrating the reference semiconductor device fabricated to demonstrate effects of the semiconductor devices of the present disclosure.
Figure 28:
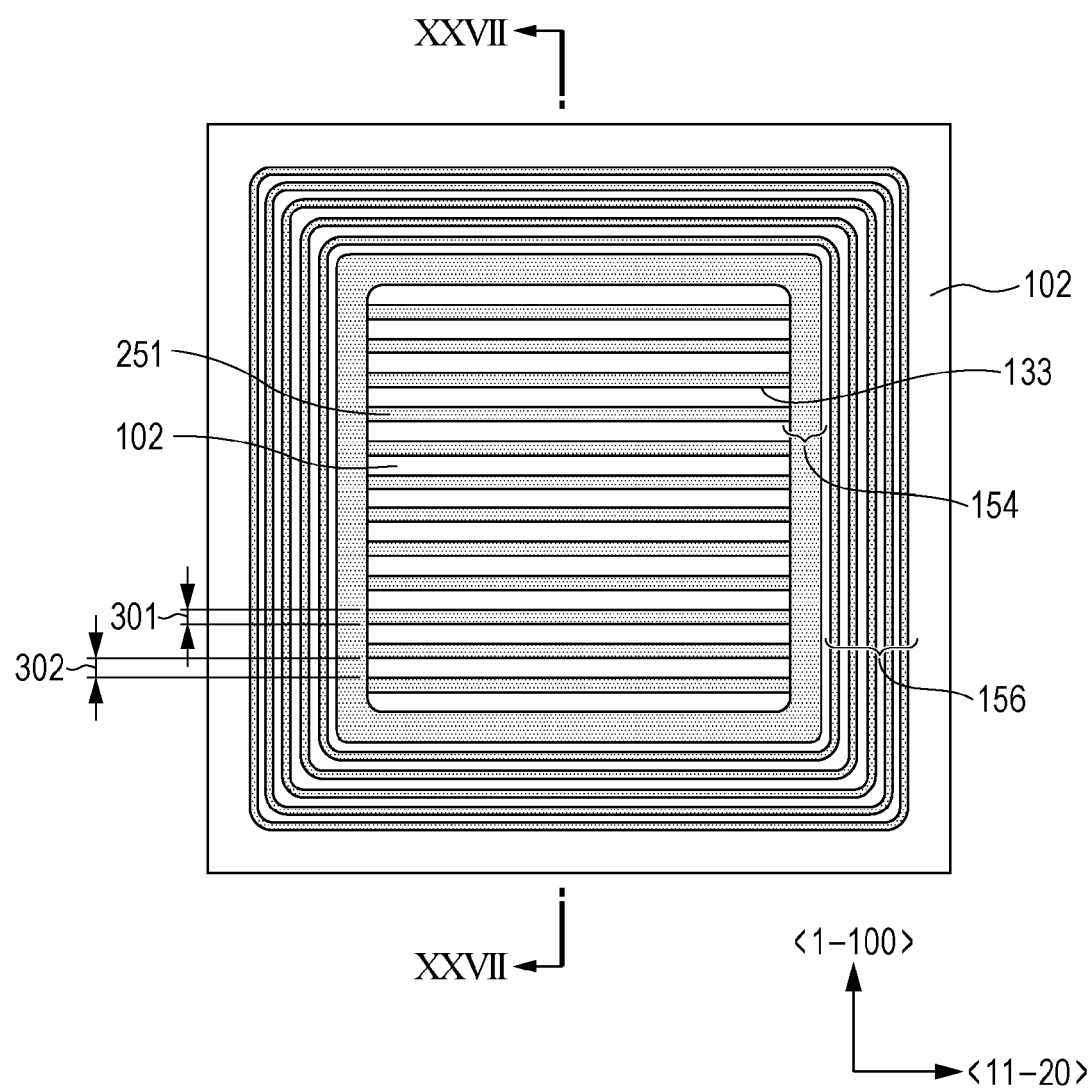
FIG. 28 is a top plan view schematically illustrating a silicon carbide layer in the reference semiconductor device fabricated to demonstrate effects of the semiconductor devices of the present disclosure.

In order to demonstrate the effects obtained by configuring each of the barrier regions to have a boundary with the silicon carbide semiconductor layer that is parallel to <11-20> direction on the surface of the silicon carbide semiconductor layer, semiconductor devices 205 illustrated in FIGS. 27 and 28 were fabricated. FIGS. 27 and 28 are a sectional view of the semiconductor device 205 and a plan view of a surface 122 of a silicon carbide semiconductor layer 102, respectively. The semiconductor device 205 differs from the semiconductor device 201 in that a plurality of barrier regions 251 do not include any second barrier regions 352 segmented in <11-20> direction. Except for this difference, the configuration of the semiconductor device 205 is the same as that of the semiconductor device 201 and thus will not be described anew.

Figure 4:
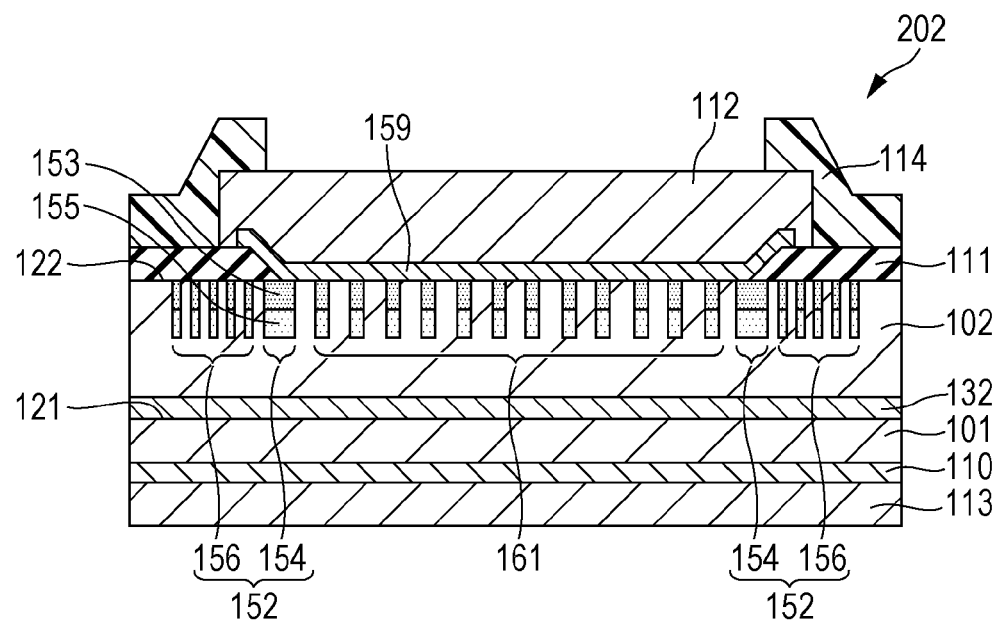
FIG. 4 is a sectional view schematically illustrating a semiconductor device fabricated as a first comparative example.
Figure 5:
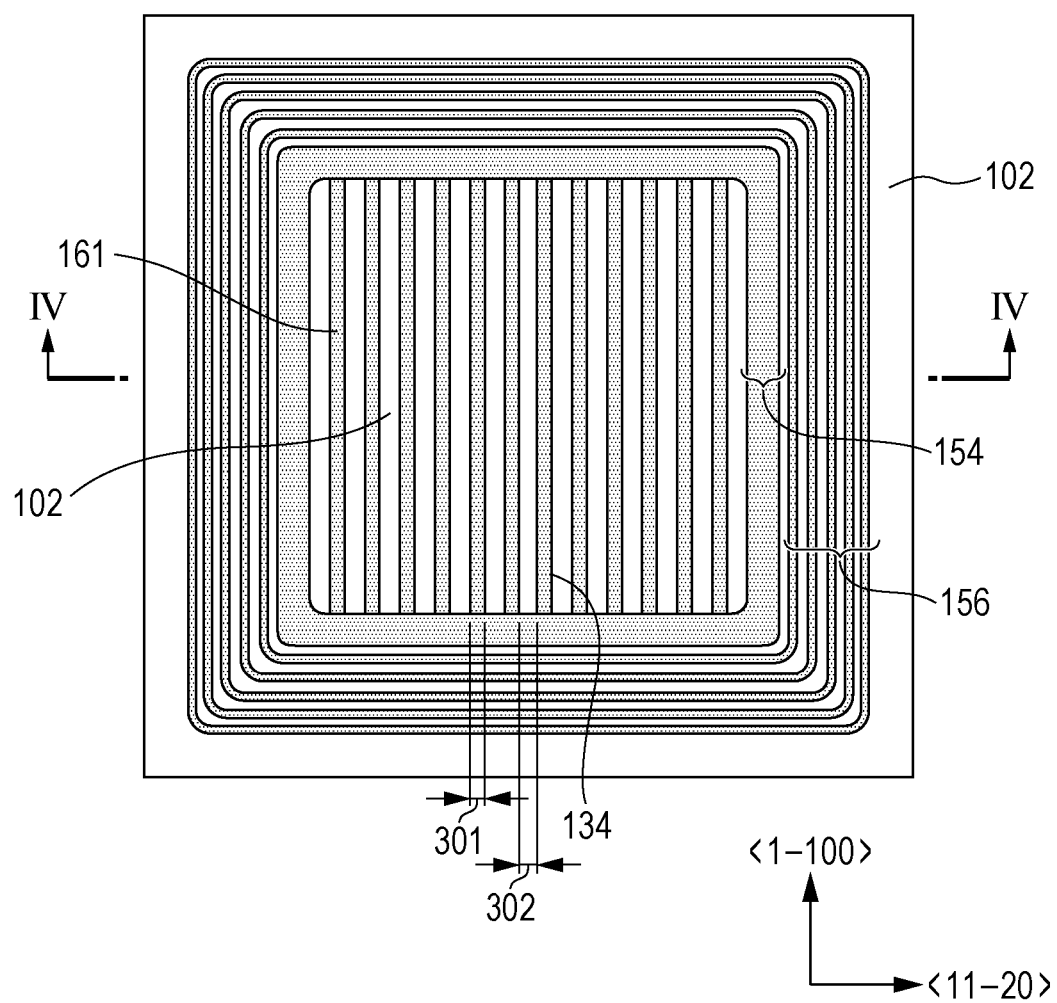
FIG. 5 is a plan view schematically illustrating a silicon carbide layer in the first comparative semiconductor device as viewed from above.

As comparative examples, semiconductor devices 202 and semiconductor devices 203 were provided. FIGS. 4 and 5 are a sectional view of the semiconductor device 202 and a plan view of a surface 122 of a silicon carbide semiconductor layer 102, respectively. In the semiconductor device 202, high-concentration regions 153 and low-concentration regions 155 in barrier regions 161 have the same impurity concentration profile as in the semiconductor device 201.

As illustrated in FIG. 5, the plurality of barrier regions 161 of the semiconductor device 202 extend in the longitudinal direction of the paper sheet on the surface 122, and a boundary 134 between the barrier region 161 and the silicon carbide semiconductor layer 102 is perpendicular to <11-20> direction. For example, the width 301 of the barrier region 161 is 2 μm and the spacing 302 between the adjacent barrier regions 161 is 4 μm.

Figure 6:
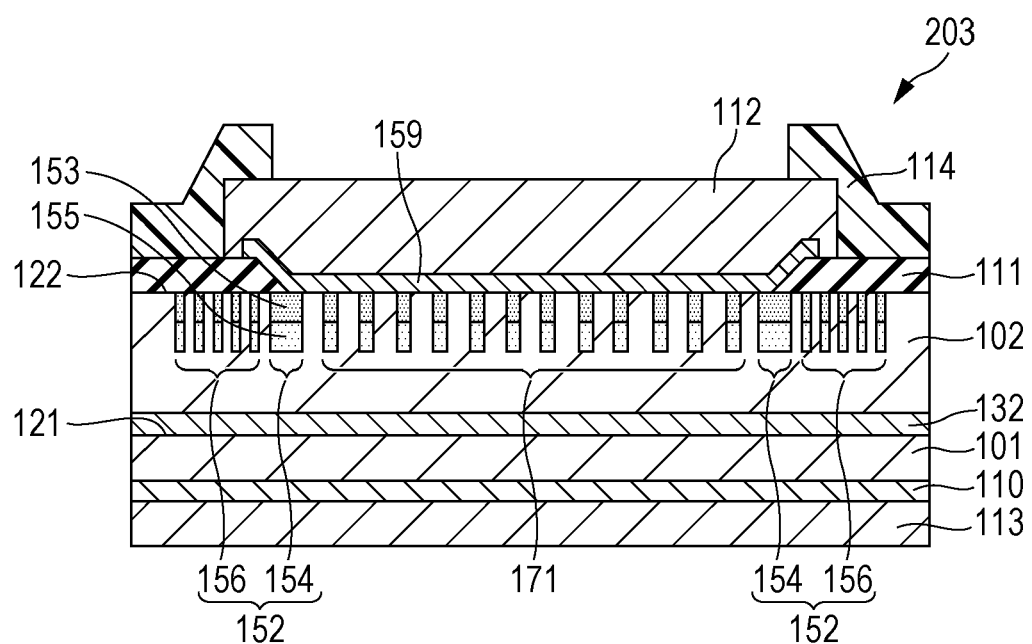
FIG. 6 is a sectional view schematically illustrating a semiconductor device fabricated as a second comparative example.
Figure 7:
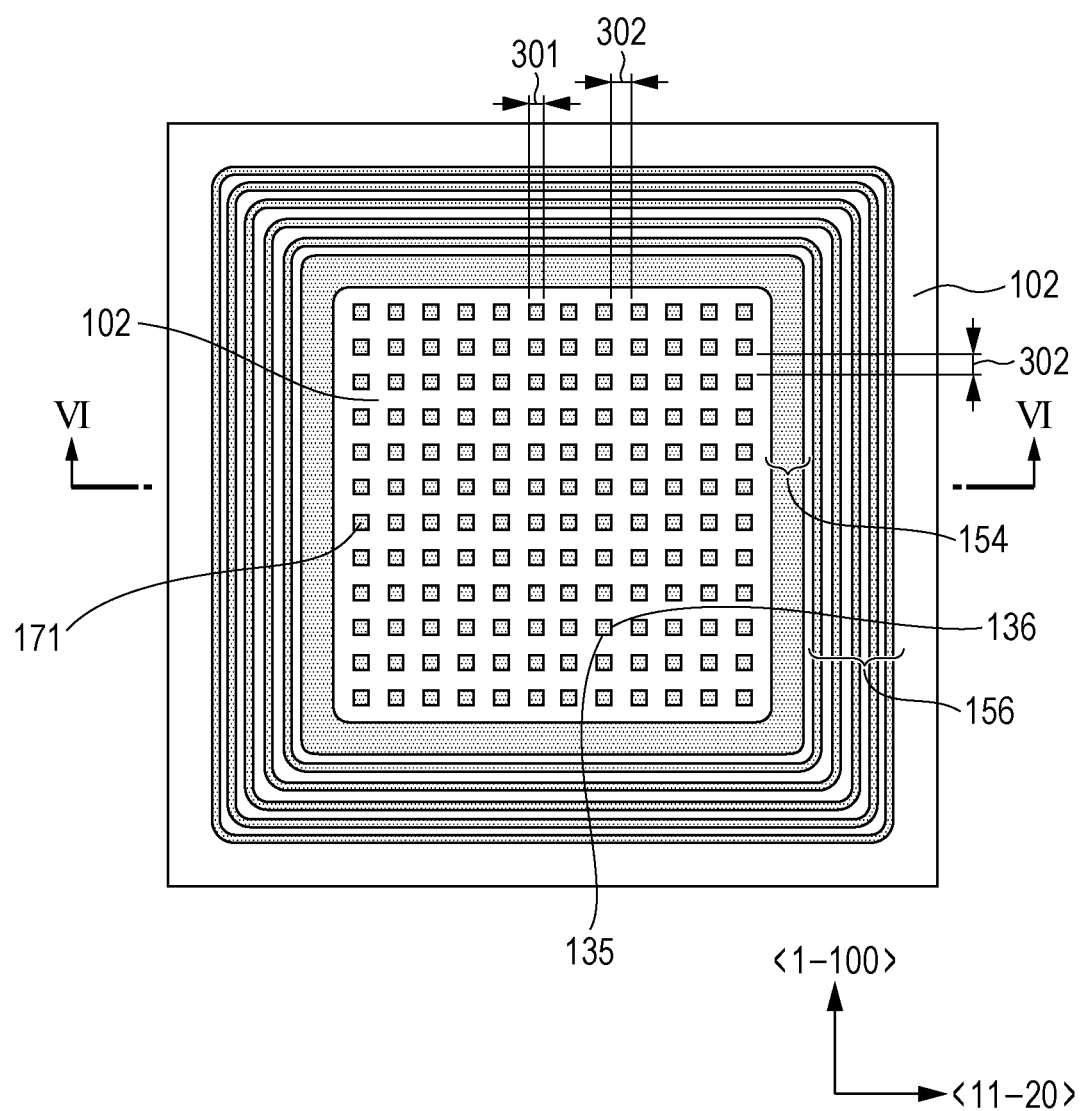
FIG. 7 is a plan view schematically illustrating a silicon carbide layer in the second comparative semiconductor device as viewed from above.

FIGS. 6 and 7 are a sectional view of the semiconductor device 203 and a plan view of a surface 122 of a silicon carbide semiconductor layer 102, respectively. In the semiconductor device 203, high-concentration regions 153 and low-concentration regions 155 in barrier regions 171 have the same impurity concentration profile as in the semiconductor device 201.

As illustrated in FIG. 7, the barrier regions 171 of the semiconductor device 203 each have a square shape on the surface 122, and are arranged two dimensionally (in the longitudinal direction and the traverse direction) while being separated from one another. For example, the barrier regions 171 each have a regular square shape on the surface 122, and the length 301 of each side of the regular square is 2 μm. For example, the spacings 302 between the barrier regions 171 adjacent to each other in the longitudinal direction and the traverse direction are each 3 μm. A side 135 and a side 136 of the boundary between the barrier region 171 and the silicon carbide semiconductor layer 102 are parallel to <11-20> direction and <1-100> direction, respectively, on the surface 122. That is, the side 136 of the boundary is perpendicular to <11-20> direction.

The semiconductor devices 205, 202 and 203 differing in the configuration of the barrier regions were fabricated on a 4H—SiC wafer as the semiconductor substrate 101, and were tested to determine the breakdown voltage. The results are described in FIG. 8. In order to reduce the influence caused by differences in the process conditions, the semiconductor devices 205, 202 and 203 were formed on the single wafer close to one another. The breakdown voltage is measured by applying a negative voltage to an upper electrode 112 relative to a backside electrode 113. In the graph shown in FIG. 8, the abscissa indicates the distance from the center of the silicon carbide substrate, and the negative marks are distances on the orientation flat side of the silicon carbide substrate and the positive marks are distances on the side opposite to the orientation flat side. The reason why the breakdown voltage has a distribution depending on the distance from the center of the wafer is because the silicon carbide semiconductor layer 102 formed on the semiconductor substrate 101 has an in-plane concentration distribution. For example, the concentration of n-type (first conductivity type) impurity is higher on the wafer periphery than in the inner side of the wafer.

Figure 8:
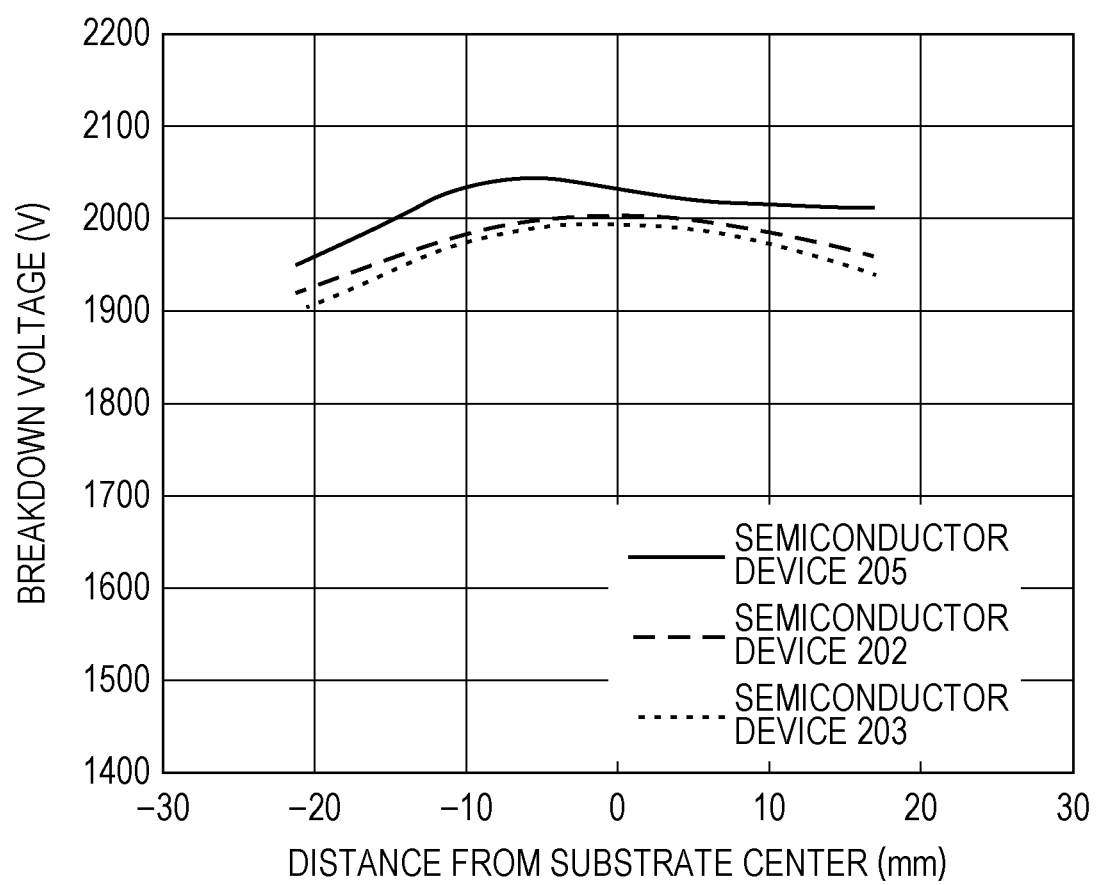
FIG. 8 is a diagram illustrating the breakdown voltage of a reference semiconductor device fabricated to demonstrate effects of the semiconductor devices of the present disclosure, and the breakdown voltage of the first and second comparative semiconductor devices.

As shown in FIG. 8, the semiconductor devices 205 exhibited the highest breakdown voltage and the semiconductor devices 203 had the lowest breakdown voltage in all the range of distances from the center of the semiconductor substrate. From FIG. 8, the median values of breakdown voltage of the semiconductor devices 205, 202 and 203 are calculated to be 2015 V, 1975 V and 1960 V, respectively. As mentioned above, these semiconductor devices were formed on the single 3-inch wafer close to one another. It is therefore reasonable to assume that the semiconductor devices 205, 202 and 203 located at the same distance from the wafer center are very similar to one another in terms of the concentration and thickness of the silicon carbide semiconductor layer 102 and also in terms of the concentration profile in the implanted regions 157. That is, it can be said that the difference in breakdown voltage among the semiconductor devices 205, 202 and 203 is ascribed to the manners of arrangement and the shapes of the barrier regions 251, 161 and 171.

In particular, the comparison of the semiconductor device 205 to the semiconductor device 202 will be discussed. These two semiconductor devices have the same width of the barrier regions and the same spacing between the barrier regions, and are different from each other only in that the barrier regions 251 and the barrier regions 161 both in the form of stripes extend in different directions. Thus, the above results have shown that a higher breakdown voltage can be obtained when the barrier regions in the form of stripes are such that, as is the case in the barrier regions 251, the boundaries 133 between the barrier region 251 and the silicon carbide semiconductor layer 102 are parallel to <11-20> direction on the surface 122 of the silicon carbide semiconductor layer 102 than when, as is the case in the barrier regions 161, the boundaries 134 between the barrier region 161 and the silicon carbide semiconductor layer 102 are parallel to <1-100> direction on the surface 122 of the silicon carbide semiconductor layer 102.

Further, it has been shown that the semiconductor device 203 has a lower breakdown voltage than the semiconductor device 205 and compares substantially equally or slightly unfavorably to the semiconductor device 202 in terms of breakdown voltage. As illustrated in FIG. 7, the barrier regions 171 in the semiconductor device 203 have a square shape on the surface 122. In the case of square barrier regions, the boundaries between the barrier region and the silicon carbide semiconductor layer are made up of lines that extend in two perpendicular directions on the surface of the silicon carbide semiconductor layer. In the barrier regions 171, the side 135 of the boundary between the barrier region 171 and the silicon carbide semiconductor layer 102 is parallel to <11-20> direction on the surface 122 of the silicon carbide semiconductor layer 102, and the side 136 of the boundary is parallel to <1-100> direction. Thus, similarly to the case of the semiconductor device 202, the barrier regions 171 in the semiconductor device 203 have boundaries whose sides are parallel to <1-100> direction.

From the foregoing discussion, it has been shown that the breakdown voltage of the semiconductor devices is decreased when the boundaries between the barrier region and the silicon carbide semiconductor layer include sides parallel to <1-100> direction. That is, it has been shown that the breakdown voltage of the semiconductor devices can be increased when all the sides of the boundaries between the barrier region and the silicon carbide semiconductor layer are parallel to <11-20> direction, as compared to when the semiconductor devices include such boundaries having sides parallel to <1-100> direction.

Next, the discussion focuses on the edge termination region. As illustrated in FIGS. 28, 5 and 7, the edge termination region 152 includes square rings. Thus, the boundaries between the edge termination region 152 and the silicon carbide semiconductor layer 102 include sides parallel to <11-20> direction and sides parallel to <1-100> direction on the surface 122 of the silicon carbide semiconductor layer 102. Because the configuration of the edge termination region 152 is common in the semiconductor devices 205, 202 and 203, it is reasonable to assume that the directions of the boundaries of the edge termination region 152 do not affect the breakdown voltage of the semiconductor devices.

Figure 9:
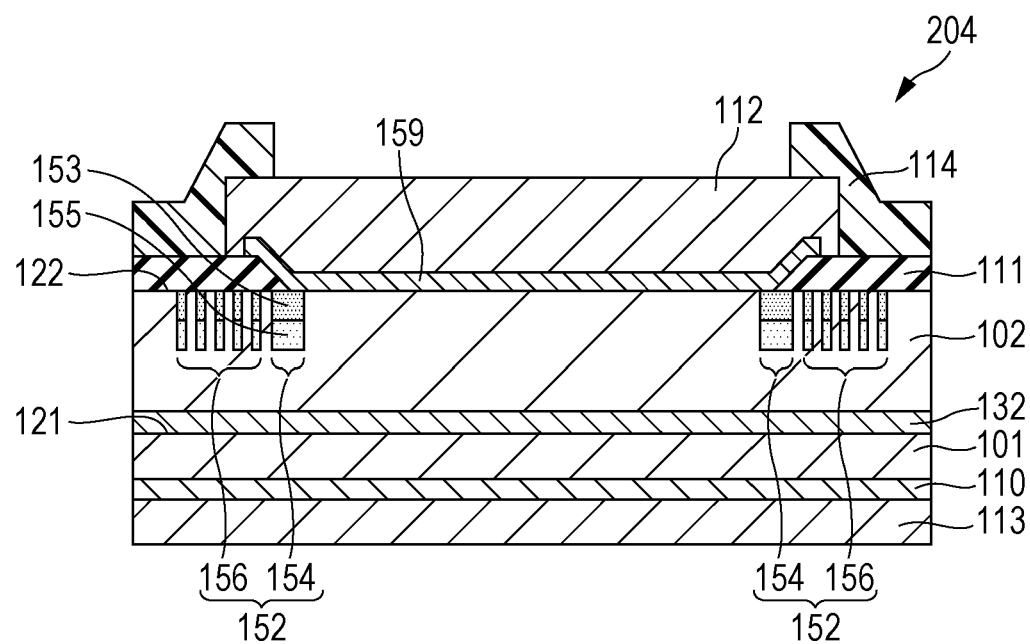
FIG. 9 is a sectional view schematically illustrating a semiconductor device fabricated as a third comparative example.
Figure 10:
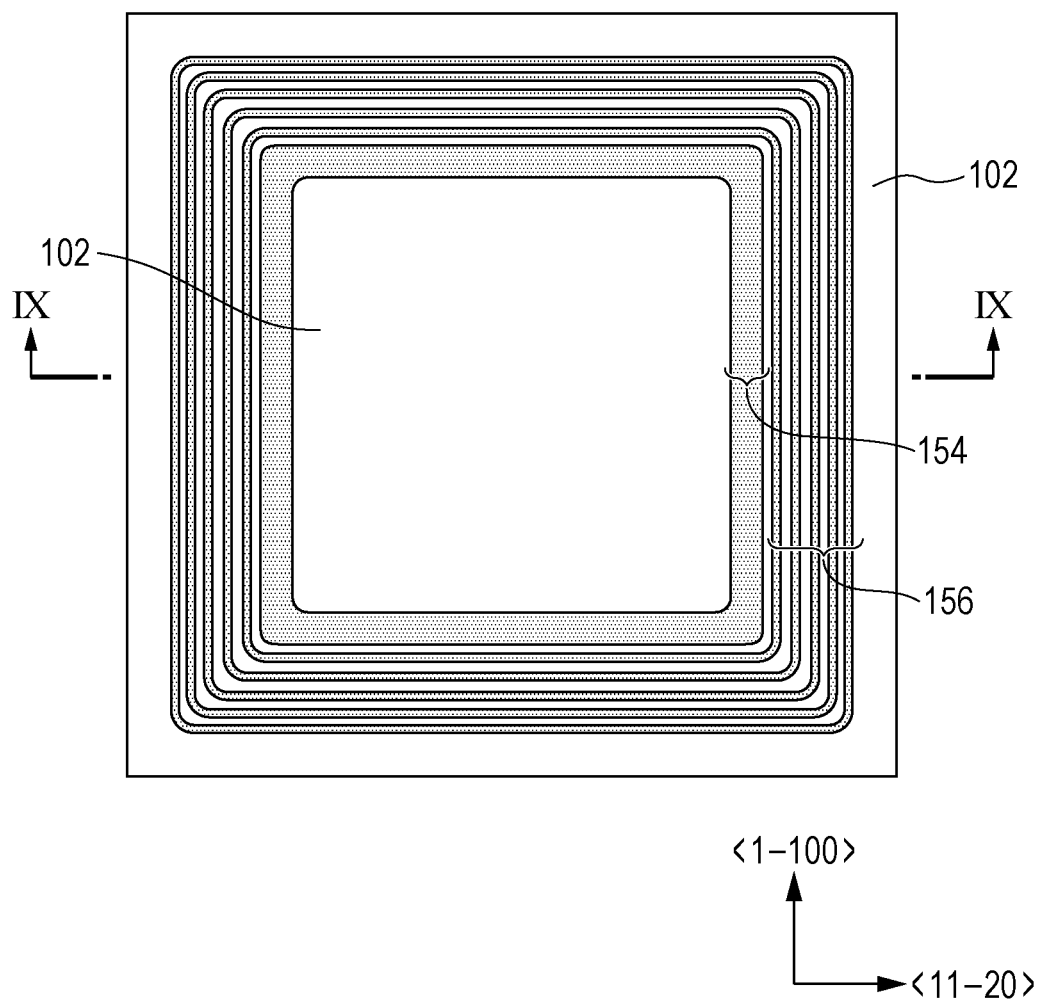
FIG. 10 is a plan view schematically illustrating a silicon carbide layer in the third comparative semiconductor device as viewed from above.
Figure 11:
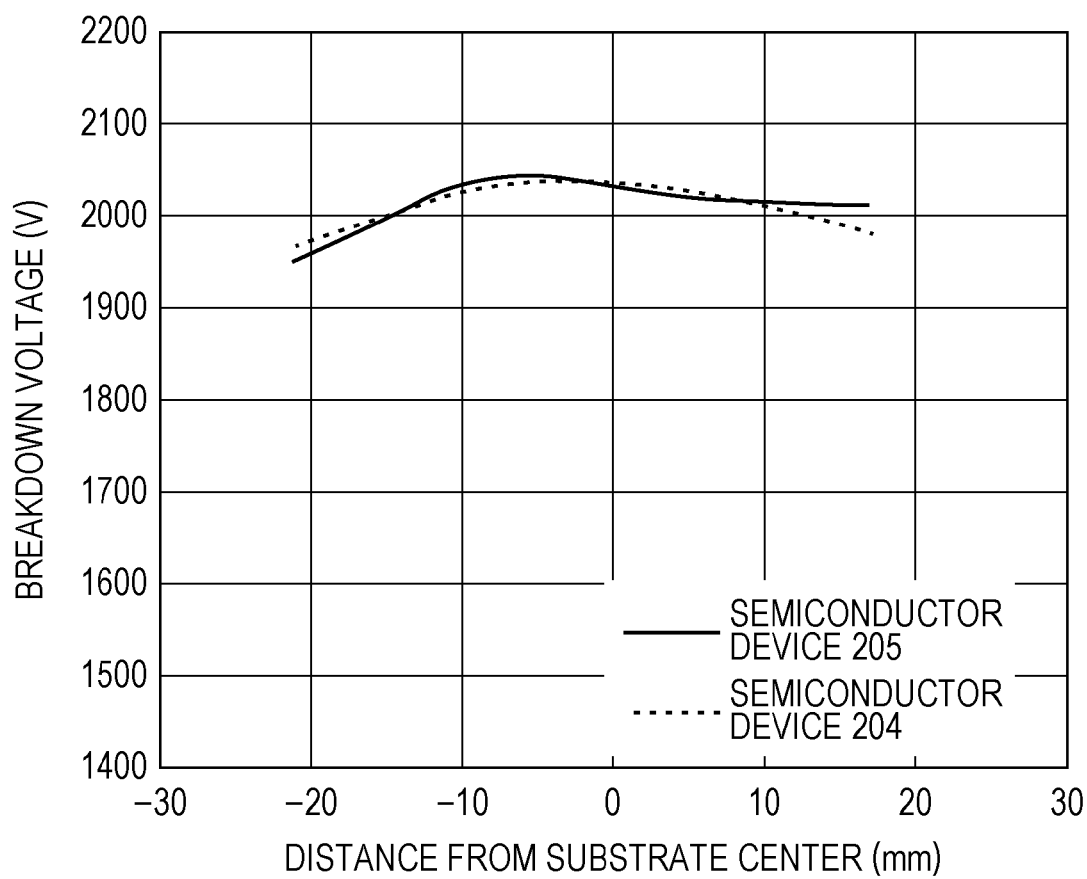
FIG. 11 is a diagram illustrating the breakdown voltage of the reference semiconductor device fabricated to demonstrate effects of the semiconductor devices of the present disclosure, and the breakdown voltage of the third comparative semiconductor device.

To confirm this assumption, a semiconductor device 204 was fabricated which was the same as the semiconductor device 205 except that the semiconductor device 204 had no barrier regions 251. FIGS. 9 and 10 are a sectional view of the semiconductor device 204 and a plan view of a surface 122 of a silicon carbide semiconductor layer 102, respectively. As illustrated in FIG. 11, measurement has shown that the semiconductor device 204 has substantially the same level of breakdown voltage as the semiconductor device 205.

Based on the results described above, it has been shown that the breakdown voltage of the semiconductor devices discussed in the present embodiment is reduced if the boundaries between the barrier region and the silicon carbide semiconductor layer 102 include sides parallel to <1-100> direction on the surface 122 of the silicon carbide semiconductor layer 102, and is enhanced when all the sides of the boundaries are parallel to <11-20> direction.

As discussed above, the semiconductor devices having different types of barrier regions exhibit different levels of breakdown voltage even when the concentrations and thicknesses of the silicon carbide semiconductor layers 102 are similar. Thus, controlling the configuration of the barrier regions makes it possible to realize semiconductor devices having a high breakdown voltage, and also makes it possible to reduce the forward on-state voltage of the semiconductor devices while ensuring a sufficient level of breakdown voltage. In the manufacturing of, for example, semiconductor devices that can withstand a reverse voltage of 1700 V, it is often the case that the semiconductor devices are designed so that the breakdown voltage will be, for example, about 2000 V in consideration of the in-plane distributions of concentration and thickness in the silicon carbide semiconductor layer 102, and the variation in such properties among the silicon carbide semiconductor layers. Assume that, for example, a breakdown voltage of 2000 V is realized by employing the configuration of the semiconductor device 203 having the barrier regions 171 illustrated in FIGS. 6 and 7. Here, the concentration and the thickness of the silicon carbide semiconductor layer 102 are written as n and d, respectively. When the semiconductor device 201 having the barrier regions 151 is fabricated with the same concentration and thickness of the silicon carbide semiconductor layer 102 as in the semiconductor device 203, the breakdown voltage is expected to be increased to, for example, about 2050 V. in this case, the breakdown voltage is controlled to approximately 2000 V by reselecting the concentration and/or the thickness of the silicon carbide semiconductor layer 102. Because there is a margin of about 50 V by which a decrease in breakdown voltage is acceptable, it is possible to, for example, increase the concentration in the silicon carbide semiconductor layer or to reduce the thickness of the silicon carbide semiconductor layer. The increase in concentration and the reduction in thickness of the silicon carbide semiconductor layer both result in a decrease in drift resistance. That is, the semiconductor device 201, which in this case has the same breakdown voltage as the semiconductor device 203, exhibits a lower resistance in the forward direction by virtue of the increase in concentration or the reduction in thickness of the silicon carbide semiconductor layer. Thus, the on-state voltage of the semiconductor device can be reduced.

Further, because the semiconductor device 201 of the present embodiment is such that some of the barrier regions 151 include segments separated in <11-20> direction, the barrier regions 151 represent a reduced proportion of the area enclosed by the guard ring subregion 154 as compared to the semiconductor device 205 illustrated in FIGS. 27 and 28. This configuration of the semiconductor device 201 allows a current to flow in an increased amount at a certain voltage applied in the forward direction, namely, when a certain positive voltage is applied to the upper electrode 112 relative to the backside electrode 113, thus resulting in a decrease in the on-state voltage of the semiconductor device 201.

(Methods for Manufacturing Semiconductor Devices)

Next, a method for manufacturing the semiconductor device 201 according to the present embodiment will be described with reference to FIGS. 12 to 20. FIGS. 12 to 20 are sectional views illustrating steps in the method for manufacturing the semiconductor device 201 according to the present embodiment.

First, a semiconductor substrate 101 is provided. For example, the semiconductor substrate 101 is a low-resistance n-type 4H—SiC (0001) offcut substrate having a resistivity of about 0.02 Ωcm. For example, the offcut direction is <11-20> direction. The orientation flat in the semiconductor substrate 101 is parallel to <11-20> direction, and photomasks used in the formation of the semiconductor device 201 are aligned with reference to the orientation flat.

Figure 12:
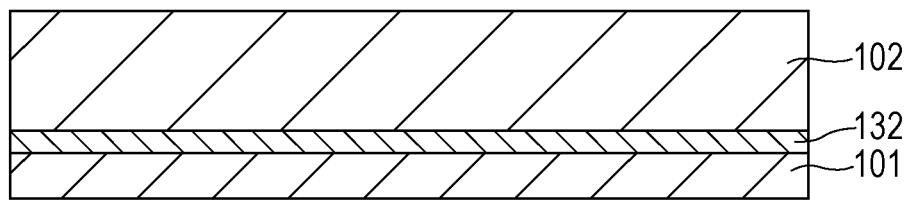
FIG. 12 is a sectional view schematically illustrating a step in the manufacturing of the semiconductor device according to the first embodiment of the present disclosure.

As illustrated in FIG. 12, a high-resistance n-type silicon carbide semiconductor layer 102 is epitaxially grown on the semiconductor substrate 101. Prior to the formation of the silicon carbide semiconductor layer 102, an n-type SiC buffer layer 132 having a high impurity concentration may be deposited on the semiconductor substrate 101. The impurity concentration in the buffer layer 132 is, for example, $1 \times 10^{18}$ cm$^{-3}$, and the thickness of the buffer layer 132 is, for example, 1 μm. For example, the silicon carbide semiconductor layer 102 is formed of n-type 4H—SiC, and has an impurity concentration of $1 \times 10^{16}$ cm$^{-3}$ and a thickness of 10 μm.

Figure 13:
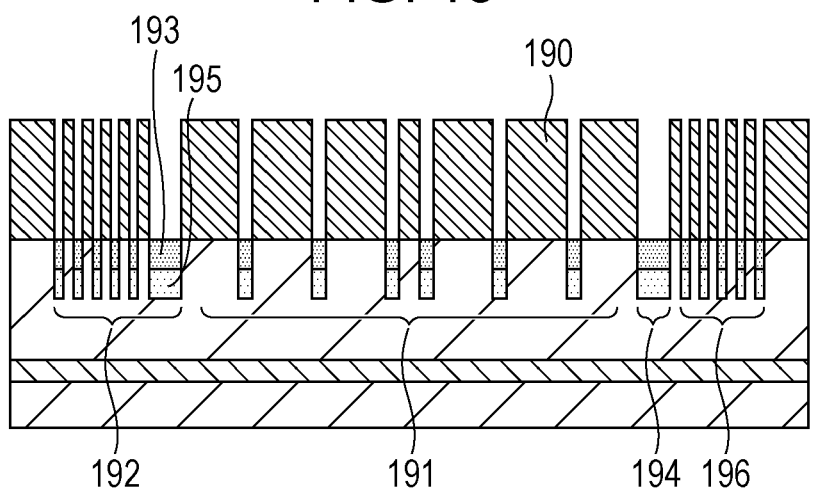
FIG. 13 is a sectional view schematically illustrating a step in the manufacturing of the semiconductor device according to the first embodiment of the present disclosure.

Next, as illustrated in FIG. 13, a mask 190 made of, for example, SiO$_2$ that has a pattern for defining barrier regions 151 and an edge termination region 152 is formed on the silicon carbide semiconductor layer 102. Thereafter, ions, for example, Al ions are implanted into the silicon carbide semiconductor layer 102 through the mask 190 to form ion implanted regions 191, 192, 194 and 196. For example, the magnitudes of ion implantation energy, and the doses are controlled so that the Al ions implanted will have a concentration profile similar to that illustrated in FIG. 3, that is, the ion implanted regions 191, 192, 194 and 196 will include high-concentration implanted regions 193 on the surface side and low-concentration implanted regions 195 at greater depths than the high-concentration implanted regions 193.

The high-concentration implanted regions 193 and the low-concentration implanted regions 195 formed in this step will define high-concentration regions 153 and low-concentration regions 155 in the final semiconductor device 201, Further, the ion implanted regions 191, 192, 194 and 196 will define barrier regions 151, an edge termination region 152, a guard ring subregion 154 and FLR subregions 156, respectively, later in the process. By implanting the ions into the regions at the same time, the profile of the impurity concentration in the direction perpendicular to the principal surface of the semiconductor substrate 101 is rendered identical between the edge termination region 152 and the barrier regions 151. Further, because the high-concentration regions 153 and the low-concentration regions 155 are formed at the same time using the single mask 190, the outlines of the paired high-concentration regions 153 and low-concentration regions 155 in the edge termination region 152 and in the barrier regions 151 each become identical as viewed in the direction perpendicular to the principal surface of the semiconductor substrate 101.

In the above step, the mask 190 is aligned so that on the surface 122 of the silicon carbide semiconductor layer 102, the ion implanted regions 191 will have boundaries with the silicon carbide semiconductor layer 102 which are parallel to <11-20> direction that represents crystal orientations in the semiconductor substrate 101.

Although not illustrated, an n-type impurity may be implanted into the back surface of the semiconductor substrate 101 as required to further increase the n-type concentration on the backside.

Figure 14:
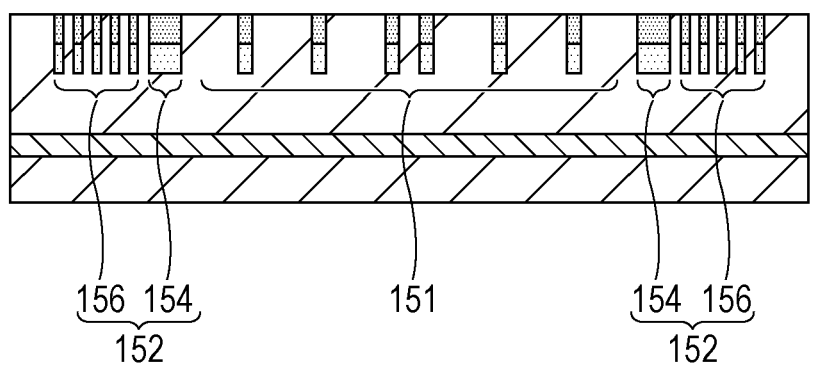
FIG. 14 is a sectional view schematically illustrating a step in the manufacturing of the semiconductor device according to the first embodiment of the present disclosure.

Next, as illustrated in FIG. 14, the mask 190 is removed and the structure on the semiconductor substrate 101 is heat treated at a temperature of about 1500° C. to 1900° C. to form barrier regions 151 and an edge termination region 152 including a guard ring subregion 154 and FLR subregions 156 which each have a high-concentration region 153 and a low-concentration region 155. In an embodiment, a carbon film may be deposited on the surface of the silicon carbide semiconductor layer 102 before the heat treatment and may be removed after the heat treatment. In this case, a thermal oxide film may be formed on the surface 122 of the silicon carbide semiconductor layer 102 after the removal and the thermal oxide film may be removed by etching to clean the surface 122 of the silicon carbide semiconductor layer 102. Referring to FIG. 2, the width 301 of the barrier region 151 is, for example, 2 μm, and the spacing 302 is, for example, 4 μm. The width of the guard ring subregion 154 is, for example, about 15 μm. The spacing between the barrier region 151 and the guard ring subregion 154 in FIG. 2 is, for example, 3 μm. The spacing between the guard ring subregion 154 and the innermost FLR subregion 156 is, for example, 1 μm.

Figure 15:
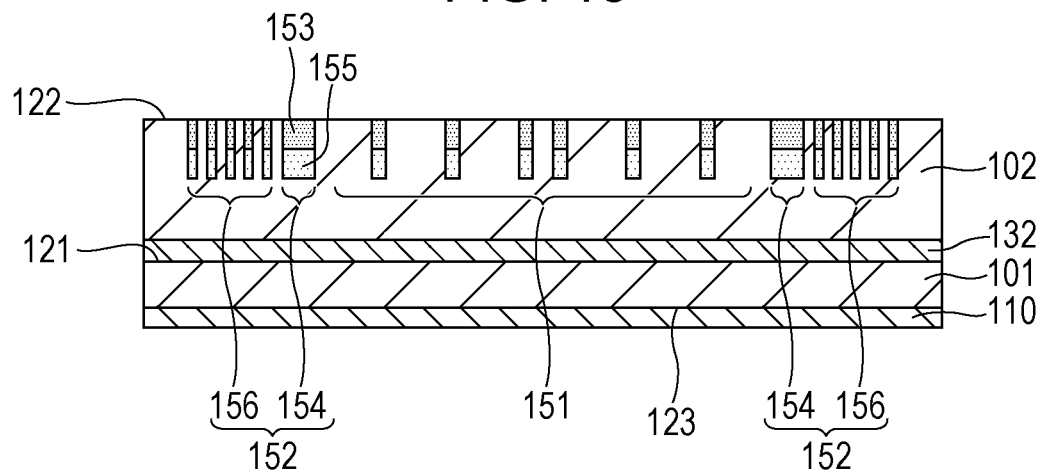
FIG. 15 is a sectional view schematically illustrating a step in the manufacturing of the semiconductor device according to the first embodiment of the present disclosure.

Next, as illustrated in FIG. 15, a second electrode 110 is formed on the back surface 123 of the semiconductor substrate 101 by depositing, for example, Ni in a thickness of about 200 nm and heat treating the Ni layer at about 1000° C. The second electrode 110 forms an ohmic junction with the back surface 123 of the semiconductor substrate 101.

Figure 16:
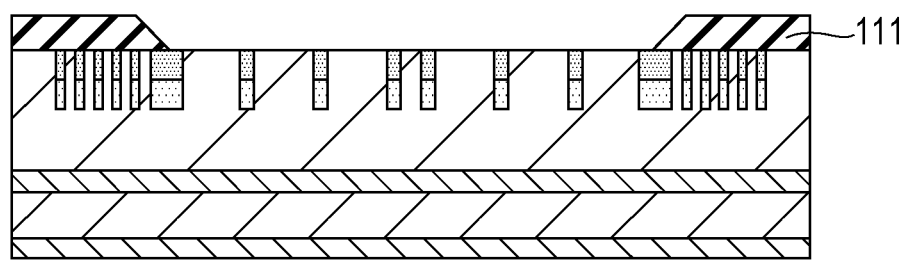
FIG. 16 is a sectional view schematically illustrating a step in the manufacturing of the semiconductor device according to the first embodiment of the present disclosure.

Next, an insulating layer made of, for example, $SiO_2$ is formed on the surface 122 of the silicon carbide semiconductor layer 102. For example, the thickness of the insulating layer is 300 nm. Next, a photoresist mask is formed and the insulating layer is treated by, for example, wet etching so as to expose a portion of the guard ring subregion 154, and the portion of the silicon carbide semiconductor layer 102 enclosed by the guard ring subregion 154. Thereafter, the mask is removed. In this manner, as illustrated in FIG. 16, an insulating layer 111 having an opening is formed.

Figure 17:
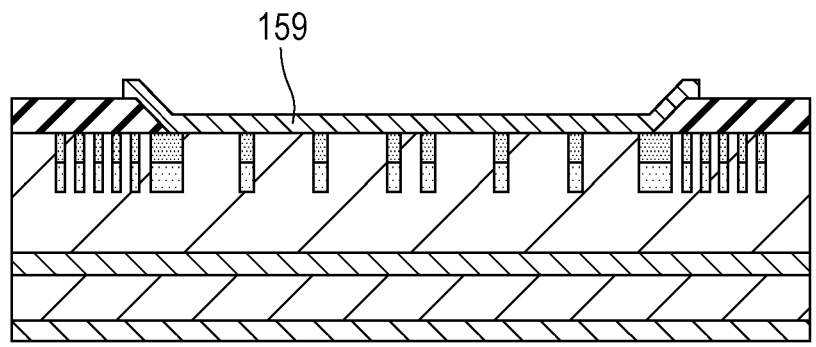
FIG. 17 is a sectional view schematically illustrating a step in the manufacturing of the semiconductor device according to the first embodiment of the present disclosure.

Next, an electrode layer is deposited so as to cover the entire surface of the insulating layer 111 and the silicon carbide semiconductor layer 102 exposed in the opening. The electrode layer includes, for example, a metal such as Ti, Ni or Mo. For example, the thickness of the electrode layer is 200 nm. After the deposition, a photoresist mask is formed, and the electrode layer is patterned so that the resultant pattern covers at least the silicon carbide semiconductor layer 102 exposed from the insulating layer 111. A patterned electrode layer is thus formed as illustrated in FIG. 17. The periphery of the electrode layer is disposed on the insulating layer 111. The electrode layer is in contact with the portion of the surface 122 of the silicon carbide semiconductor layer 102 and the portion of the guard ring subregion 154 that are exposed from the insulating layer 111. The edge of the surface of the electrode layer in contact with the silicon carbide semiconductor layer 102 is disposed on the guard ring subregion 154.

Subsequently, the structure on the semiconductor substrate 101 is heat treated at a temperature of 100° C. to 700° C. to form a first electrode 159. The first electrode 159 forms a Schottky junction with the silicon carbide semiconductor layer 102.

Figure 18:
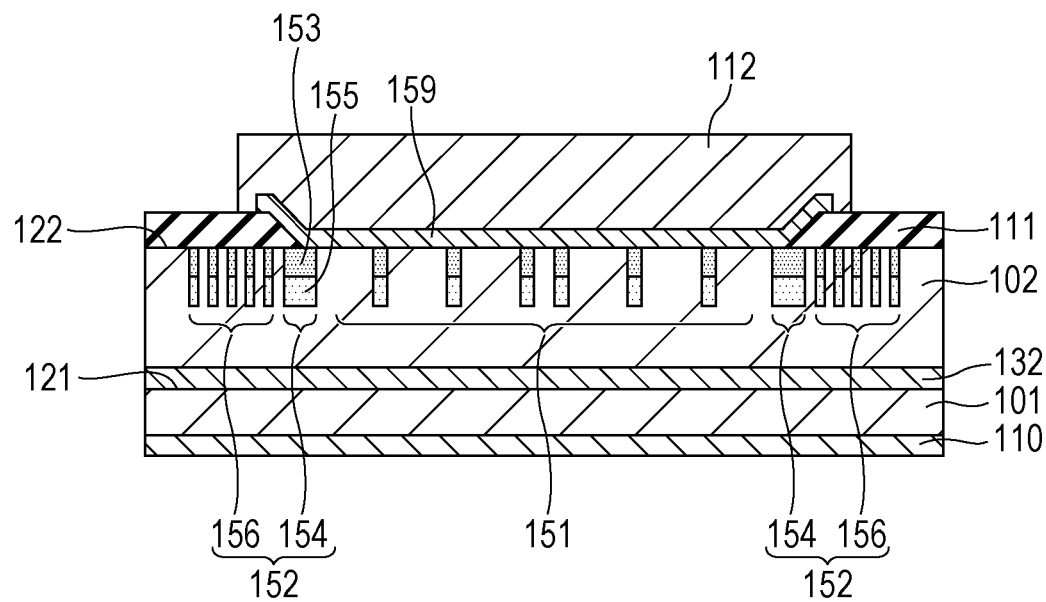
FIG. 18 is a sectional view schematically illustrating a step in the manufacturing of the semiconductor device according to the first embodiment of the present disclosure.

Next, an electrode layer is deposited on the first electrode 159 and the insulating layer 111. For example, the electrode layer is a metal film including Al and having a thickness of about 4 μm. A mask is formed on the electrode layer, and a portion of the insulating layer 111 is exposed by etching the undesired portion of the electrode layer. When the electrode layer is treated by wet etching, the etching conditions may be controlled so that the first electrode 159 will not be exposed. After the undesired portion of the electrode layer is removed by etching, the mask is removed. Consequently, an upper electrode 112 illustrated in FIG. 18 is formed.

Figure 19:
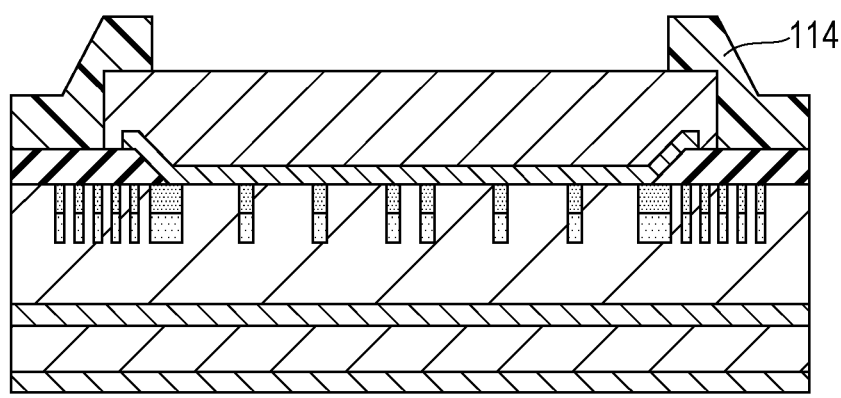
FIG. 19 is a sectional view schematically illustrating a step in the manufacturing of the semiconductor device according to the first embodiment of the present disclosure.

Next, a passivation layer illustrated in FIG. 19 is formed as required. First, a passivation layer made of, for example, SiN is formed on the exposed insulating layer 111 and the upper electrode 112. Thereafter, a mask is provided which has an opening that exposes a portion of the passivation layer located above the upper electrode 112, and the portion of the passivation layer is removed by, for example, dry etching to expose the corresponding portion of the upper electrode 112. Thereafter, the mask is removed. In this manner, as illustrated in FIG. 19, a passivation layer 114 is formed which is partially perforated on the upper electrode 112. Any materials other than SiN may be used for the formation of the passivation layer 114 as long as the materials are insulators. For example, the material of the passivation layer 114 may be $SiO_2$ or an organic material such as polyimide.

Figure 20:
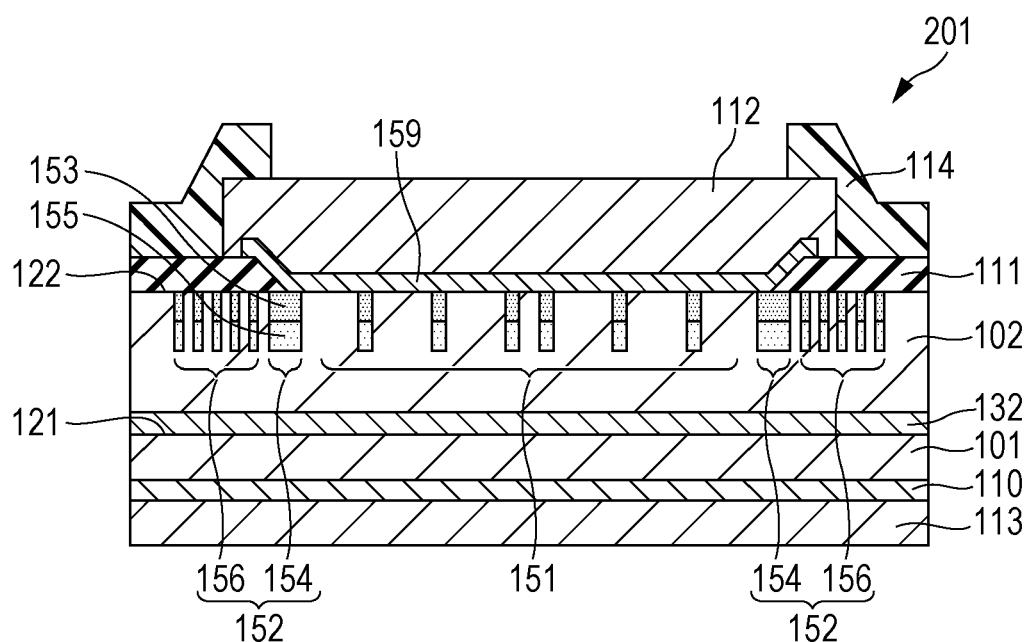
FIG. 20 is a sectional view schematically illustrating a step in the manufacturing of the semiconductor device according to the first embodiment of the present disclosure.

Next, as illustrated in FIG. 20, a backside electrode 113 is formed as required. The backside electrode may be formed before the formation of the passivation layer 114, or before the formation of the upper electrode 112. For example, the backside electrode 113 may be formed by depositing Ti, Ni and Ag in this order onto the second electrode 110. The thicknesses of these metal layers are, for example, 0.1 μm, 0.3 μm and 0.7 μm, respectively.

A semiconductor device 201 is manufactured through the steps described above.

(Modified Examples)

Hereinbelow, modified examples of the present embodiment will be described. In the semiconductor device 201 illustrated in FIGS. 1 and 2, the barrier regions 151 are stripes parallel to <11-20> direction on the surface 122 of the silicon carbide semiconductor layer 102. The barrier regions may have other shapes as long as all the sides of the boundaries are parallel to <11-20> direction on the surface 122 of the silicon carbide semiconductor layer 102.

Figure 21:
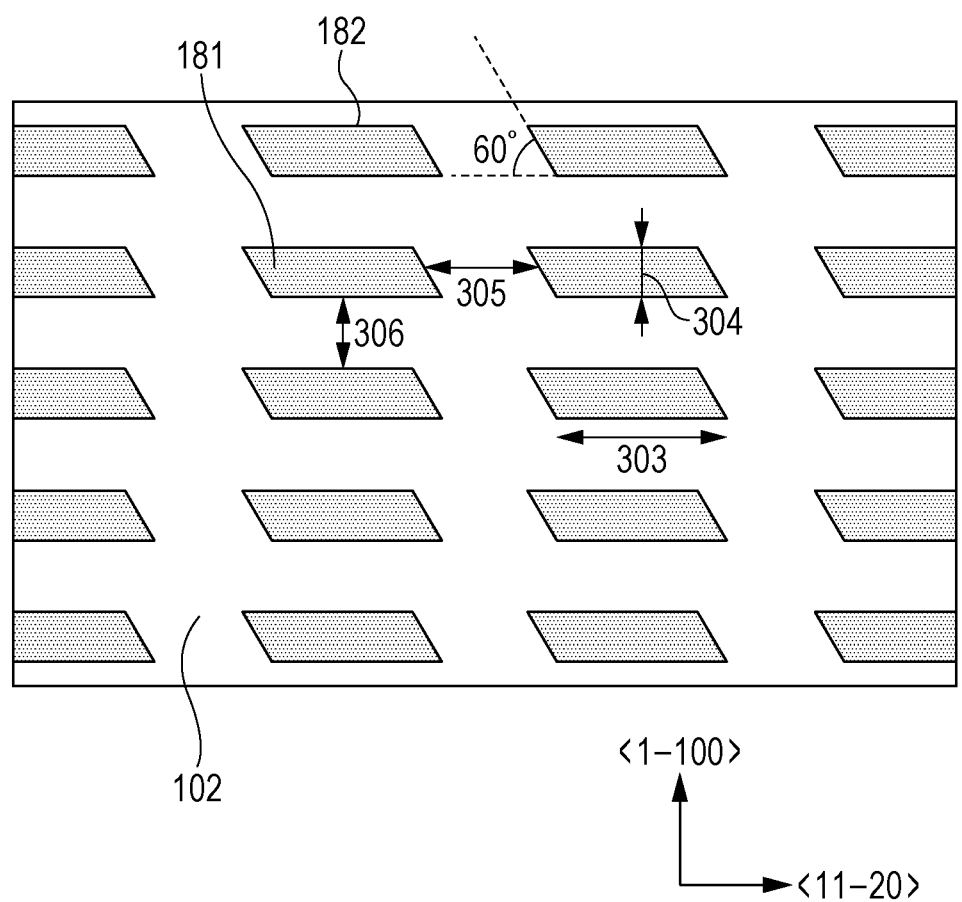
FIG. 21 is a plan view schematically illustrating barrier regions in a first modified example of the semiconductor device according to the first embodiment of the present disclosure.

For example, as illustrated in FIG. 21, barrier regions 181 may have parallelogrammatic boundaries 182 on the surface 122 of the silicon carbide semiconductor layer 102. As illustrated in FIG. 21, the parallelogrammatic boundary 182 is composed of a pair of sides parallel to <11-20> direction and a pair of sides having an angle of 60° relative to <11-20> direction. That is, the inner angles of the parallelogram are 120° or 60°. In the portion of the surface 122 enclosed by the guard ring subregion 154, the barrier regions 181 are arranged periodically in <11-20> direction and in <1-100> direction perpendicular to <11-20> direction. The barrier regions 181 are separated from one another in <11-20> direction on the surface 122.

For example, the width 303 in <11-20> direction and the width 304 in <1-100> direction of the barrier region 181 are 10 μm and 2 μm, respectively. For example, the spacing 305 in <11-20> direction and the spacing 306 in <1-100> direction between the barrier regions 181 are 3 μm and 4 μm, respectively.

The silicon carbide semiconductor belongs to the hexagonal system. In a plane including [11-20] direction and [1-100] direction, those directions having an angle of 60° or 120° relative to [11-20] are crystal orientations equivalent to [11-20] and are all <11-20> directions. Therefore, all the four sides of the parallelogram illustrated in FIG. 21 are parallel to <11-20> direction. That is, the barrier regions 181 exclusively have boundaries whose all sides are parallel to <11-20> direction on the surface 122 of the silicon carbide semiconductor layer 102.

In the structure described above, the barrier regions 181 are separated from one another in <11-20> direction, and therefore the barrier regions 181 represent a reduced proportion of the area enclosed by the guard ring subregion 154 as compared to the semiconductor device 201 illustrated in FIGS. 1 and 2. Thus, this modified configuration of the semiconductor device allows a current to flow in an increased amount at a certain voltage applied in the forward direction, namely, when a certain positive voltage is applied to the upper electrode 112 relative to the backside electrode 113, thus resulting in a decrease in on-state voltage. Further, because the barrier regions 181 exclusively have boundaries whose all sides are parallel to <11-20> direction on the surface 122 of the silicon carbide semiconductor layer 102, the semiconductor device is prevented from a decrease in breakdown voltage.

Figure 22:
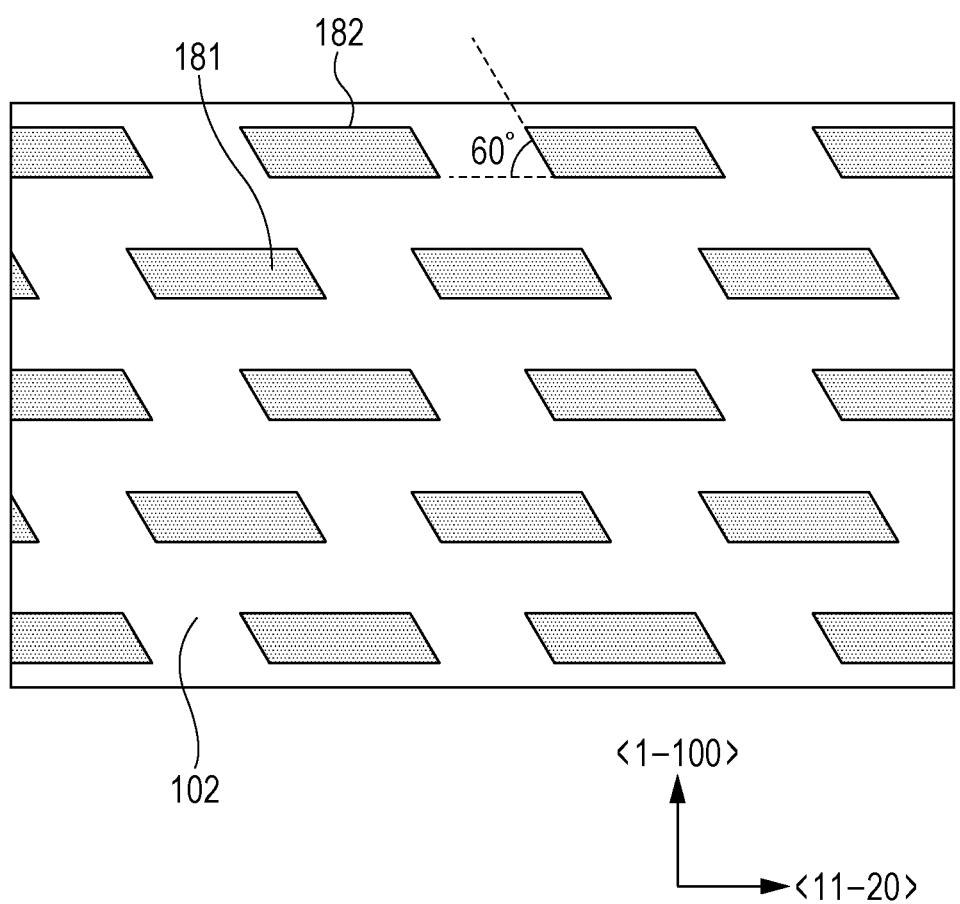
FIG. 22 is a plan view schematically illustrating barrier regions in a modification of the first modified example of the semiconductor device according to the first embodiment of the present disclosure.

The arrangement of the barrier regions 181 on the surface 122 is not limited to the example illustrated in FIG. 21. For example, as illustrated in FIG. 22, the barrier regions 181 may be staggered in <1-100> direction by half the cycle.

Figure 23:
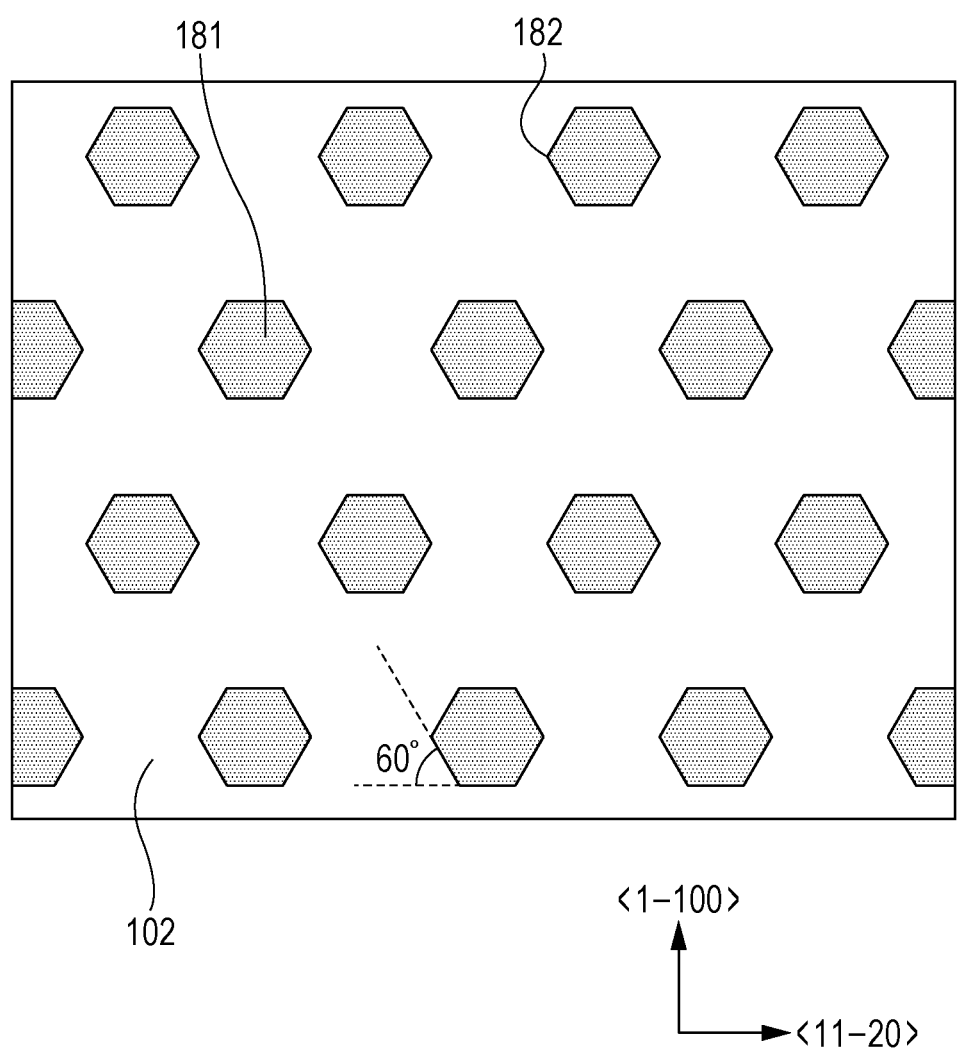
FIG. 23 is a plan view schematically illustrating barrier regions in a second modified example of the semiconductor device according to the first embodiment of the present disclosure.

The shape of the boundaries of the barrier regions 181 may be hexagonal on the surface 122 of the silicon carbide semiconductor layer 102. FIG. 23 illustrates the barrier regions 181 as having regular hexagonal boundaries 182 on the surface 122. The six sides of the regular hexagon are parallel to directions equivalent to [11-20] direction and are all parallel to <11-20> direction. All the inner angles are 120°. As illustrated in FIG. 23, the plurality of barrier regions 181 are staggered in <1-100> direction by half the cycle.

Figure 24:
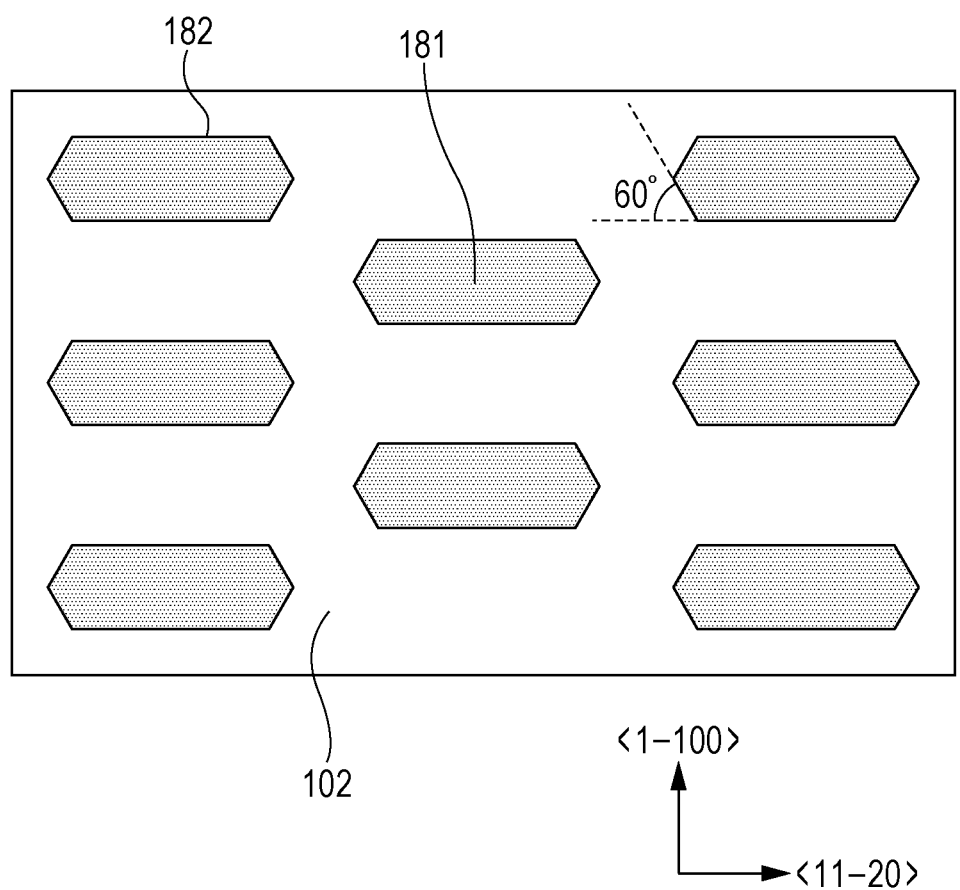
FIG. 24 is a plan view schematically illustrating barrier regions in a modification of the second modified example of the semiconductor device according to the first embodiment of the present disclosure.

Further, as illustrated in FIG. 24, the barrier regions 181 may have hexagonal boundaries 182 that extend in one direction on the surface 122. As illustrated in FIG. 24, the six sides of the hexagon are parallel to directions equivalent to [11-20] direction and are all parallel to <11-20> direction. In FIG. 24, the plurality of barrier regions 181 are staggered in <1-100> direction by half the cycle.

Figure 25:
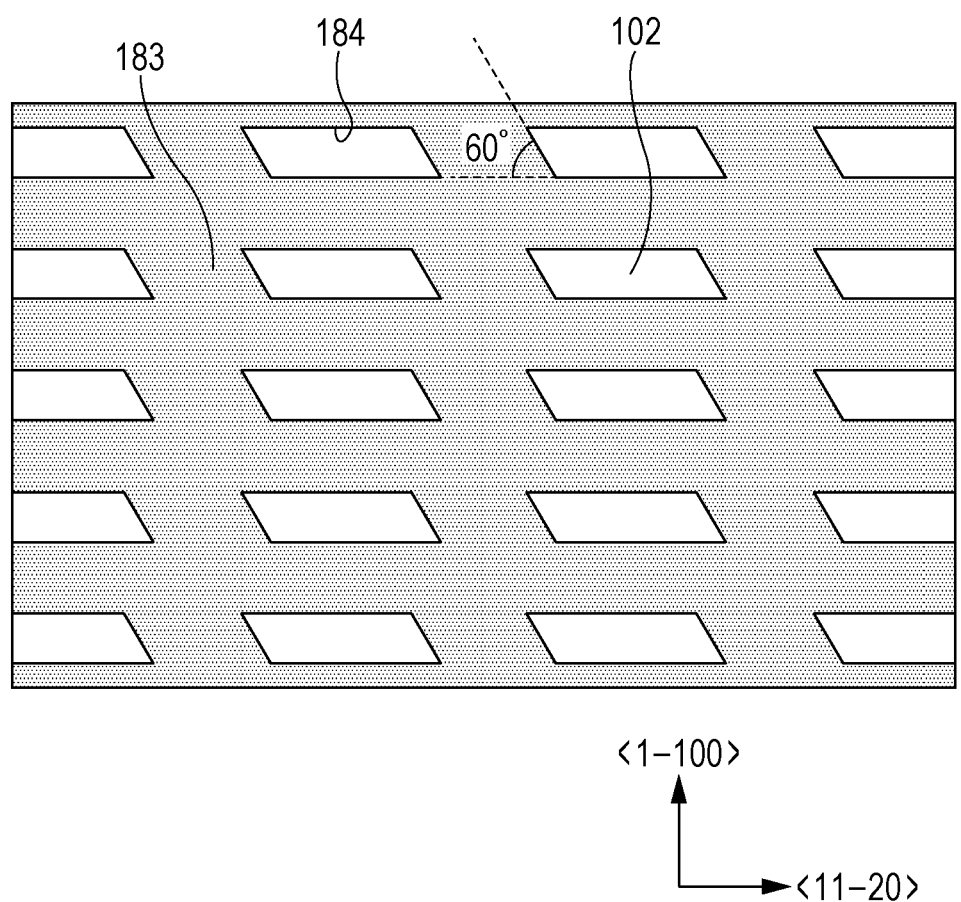
FIG. 25 is a plan view schematically illustrating a barrier region in a third modified example of the semiconductor device according to the first embodiment of the present disclosure.

As described hereinabove, the decrease in the breakdown voltage of the semiconductor device can be suppressed by ensuring that the boundaries between the barrier region 151 or 181 and the silicon carbide semiconductor layer 102 are parallel to <11-20> direction. FIG. 25 illustrates an arrangement of the silicon carbide semiconductor layer 102 and the barrier region that is an inverted version of the arrangement of the silicon carbide semiconductor layer 102 and the barrier regions 181 illustrated in FIG. 21. As illustrated in FIG. 25, the barrier region 183 has boundaries 184 that define parallelogrammatic blanks on the surface 122 of the silicon carbide semiconductor layer 102. The silicon carbide semiconductor layer 102 is exposed in the regions enclosed by the boundaries 184. The four sides of the boundary 184 form a parallelogram and are all parallel to <11-20> direction. The barrier region 183 encloses the exposed portions of the silicon carbide semiconductor layer 102.

In the structure described above, the barrier region 183 represents an increased proportion of the area enclosed by the guard ring subregion 154 as compared to when the semiconductor device has the barrier regions 181 illustrated in FIG. 21. Thus, the barrier region 183 illustrated in FIG. 25 allows the semiconductor device to achieve a reduction in leakage current in the reverse direction, namely, when a negative voltage is applied to the upper electrode 112 relative to the backside electrode 113. Further, because the barrier region 183 exclusively has boundaries whose all sides are parallel to <11-20> direction on the surface 122 of the silicon carbide semiconductor layer 102, the semiconductor device is prevented from a decrease in breakdown voltage.

Figure 26:
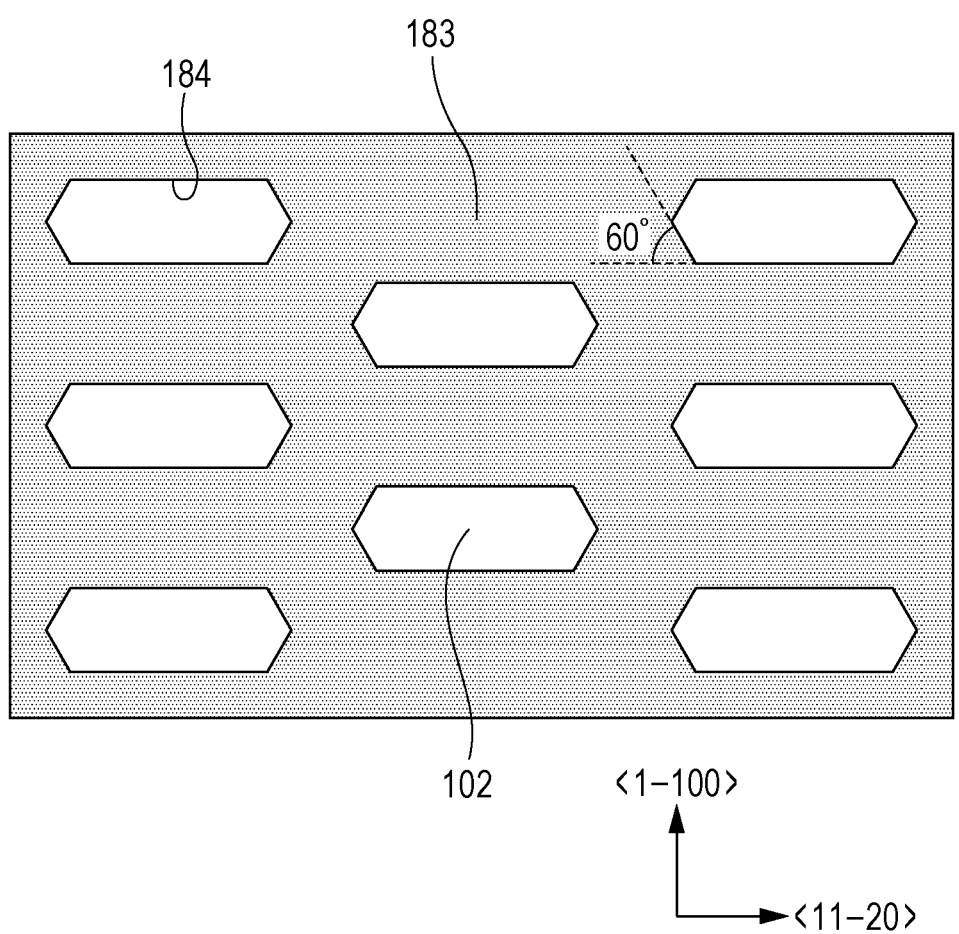
FIG. 26 is a plan view schematically illustrating a barrier region in a fourth modified example of the semiconductor device according to the first embodiment of the present disclosure.

FIG. 26 illustrates an arrangement of the silicon carbide semiconductor layer 102 and the barrier region that is inverted from the arrangement of the silicon carbide semiconductor layer 102 and the barrier regions 181 illustrated in FIG. 24. The barrier region 183 has hexagonal boundaries 184 on the surface 122 of the silicon carbide semiconductor layer 102, and the silicon carbide semiconductor layer 102 is exposed inside the boundaries 184. All the six sides of the boundary 184 are parallel to <11-20> direction. Further, the barrier region 183 encloses the exposed portions of the silicon carbide semiconductor layer 102. With this configuration, the semiconductor device is prevented from a decrease in breakdown voltage.

In the present embodiment, as illustrated in FIG. 1 the implanted regions 157 include the high-concentration regions 153 and the low-concentration regions 155. As illustrated in FIG. 1, the high-concentration regions 153 are disposed near the surface 122 of the silicon carbide semiconductor layer 102, and the low-concentration regions 155 are disposed nearer to the semiconductor substrate 101 than are the high-concentration regions 153. Each pair of the high-concentration region 153 and the low-concentration region 155 have an identical outline as viewed in the direction normal to the principal surface 121 of the semiconductor substrate 101. With this configuration, the semiconductor device achieves a high breakdown voltage. It is, however, possible to obtain the aforementioned effects of preventing the decrease in breakdown voltage also in JBS semiconductor devices in which the implanted regions include only either of the high-concentration regions and the low-concentration regions, by forming the implanted regions so that the barrier regions will have boundaries with the silicon carbide semiconductor layer 102 which are parallel to <11-20> direction on the surface 122 of the silicon carbide semiconductor layer 102. In this case too, the decrease in breakdown voltage can be suppressed as compared to when the semiconductor devices include barrier regions having boundaries parallel to <1-100> direction.

While the present embodiment has illustrated the first electrode as including Ti, Ni or Mo, the first electrode may be formed of a material selected from the group consisting of other metals capable of forming a Schottky junction with the silicon carbide semiconductor layer 102, and alloys and compounds of such metals.

The widths of the barrier regions and the spacings between the barrier regions are not particularly limited as long as the boundaries between the barrier region and the silicon carbide semiconductor layer are parallel to <11-20> direction. The shape of the barrier regions as viewed from above the surface may be changed appropriately. For example, while FIG. 21 illustrates the barrier regions 181 as having a parallelogrammatic shape on the surface 122, the barrier regions 181 may have a rhombus shape.

In an embodiment, a barrier film including, for example, TiN may be formed between the first electrode 159 and the upper electrode 112. The thickness of the barrier film is, for example, 50 nm.

While the embodiments of the present disclosure have illustrated the silicon carbide as being 4H—SiC, the silicon carbide is not limited thereto and may be other polytype such as 6H—SiC. Further, while the embodiments of the present disclosure have illustrated the principal surface of the SiC substrate as being offcut relative to (0001) plane, the principal surface of the SiC substrate may be (000-1) plane or a plane with an offcut relative to (000-1) plane.

What is claimed is:

1. A semiconductor device comprising:
a semiconductor substrate having a first conductivity type and having a principal surface and a back surface;
a silicon carbide semiconductor layer having the first conductivity type and disposed on the principal surface of the semiconductor substrate;
barrier regions having a second conductivity type and disposed within the silicon carbide semiconductor layer;
an edge termination region having the second conductivity type and disposed within the silicon carbide semiconductor layer, the edge termination region enclosing the barrier regions as viewed in a direction normal to the principal surface;
a first electrode disposed on the silicon carbide semiconductor layer and forming a Schottky junction with the silicon carbide semiconductor layer; and
a second electrode disposed on the back surface of the semiconductor substrate and forming an ohmic junction with the semiconductor substrate; wherein:
the first electrode has a surface in contact with the silicon carbide semiconductor layer;
the first electrode is in contact with the edge termination region along an edge portion of the surface of the first electrode in contact with the silicon carbide semiconductor layer;
each of the barrier regions has a polygonal boundary with the silicon carbide semiconductor layer as viewed in the direction normal to the principal surface;
each of sides of the polygonal boundary has an angle of −5° to 5° inclusive relative to a [11-20] direction, or an equivalent thereof, of crystal orientations of the semiconductor substrate;
the barrier regions are arranged periodically as viewed in the direction normal to the principal surface; and
at least two of the barrier regions are separated from each other in the [11-20] direction, or the equivalent thereof, of the crystal orientations of the semiconductor substrate.

2. The semiconductor device according to claim 1, wherein
the polygonal boundary has an inner angle of 60° or 120°.

3. The semiconductor device according to claim 1, wherein
the polygonal boundary is parallelogrammatic or hexagonal.

4. The semiconductor device according to claim 1, wherein
the edge termination region and the barrier regions each include a pair of a high-concentration region disposed in contact with a surface of the silicon carbide semiconductor layer and a low-concentration region disposed between the semiconductor substrate and the high-concentration region;
the high-concentration regions and the low-concentration regions each include a second conductivity type impurity; and
an impurity concentration in the high-concentration regions is higher than an impurity concentration in the low-concentration regions.

5. The semiconductor device according to claim 4, wherein
each pair of the high-concentration region and the low-concentration region have an identical outline as viewed in the direction normal to the principal surface.

6. The semiconductor device according to claim 1, wherein
the edge termination region includes a guard ring subregion having the second conductivity type and disposed in contact with the first electrode, and a floating subregion having the second conductivity type and disposed out of contact with the guard ring subregion, the floating subregion enclosing the guard ring subregion as viewed in the direction normal to the principal surface.

7. The semiconductor device according to claim 4, wherein
the impurity concentration in a direction of depth of the low-concentration regions has a profile including an upward curve.

8. The semiconductor device according to claim 7, wherein
the impurity concentration in the high-concentration regions is not less than $1 \times 10^{19}$ cm$^{-3}$ and the impurity concentration in the low-concentration regions is less than $1 \times 10^{19}$ cm$^{-3}$.

9. The semiconductor device according to claim 7, wherein
the impurity concentration in the high-concentration regions is not less than $1 \times 10^{20}$ cm$^{-3}$ and the impurity concentration in the low-concentration regions is less than $1 \times 10^{20}$ cm$^{-3}$.

10. The semiconductor device according to claim 1, wherein
the first electrode includes a metal selected from the group consisting of Ti, Ni and Mo.

11. A semiconductor device comprising:
a semiconductor substrate having a first conductivity type and having a principal surface and a back surface;
a silicon carbide semiconductor layer having the first conductivity type and disposed on the principal surface of the semiconductor substrate;
a barrier region having a second conductivity type and disposed within the silicon carbide semiconductor layer;
an edge termination region having the second conductivity type and disposed within the silicon carbide semiconductor layer, the edge termination region enclosing the barrier region as viewed in a direction normal to the principal surface;
a first electrode disposed on the silicon carbide semiconductor layer and forming a Schottky junction with the silicon carbide semiconductor layer; and a second electrode disposed on the back surface of the semiconductor substrate and forming an ohmic junction with the semiconductor substrate; wherein:

the first electrode has a surface in contact with the silicon carbide semiconductor layer;

the first electrode is in contact with the edge termination region along an edge portion of the surface of the first electrode in contact with the silicon carbide semiconductor layer;

the barrier region has a polygonal boundary with the silicon carbide semiconductor layer as viewed in the direction normal to the principal surface;

each of sides of the polygonal boundary has an angle of −5° to 5° inclusive relative to a [11-20] direction, or an equivalent thereof, of crystal orientations of the semiconductor substrate;

the barrier region encloses a portion of a surface of the silicon carbide semiconductor layer as viewed in the direction normal to the principal surface.

12. The semiconductor device according to claim 11, wherein
the polygonal boundary has an inner angle of 60° or 120°.

13. The semiconductor device according to claim 11, wherein
the polygonal boundary is parallelogrammatic or hexagonal.

14. The semiconductor device according to claim 11, wherein
the edge termination region and the barrier region each include a pair of a high-concentration region disposed in contact with the surface of the silicon carbide semiconductor layer and a low-concentration region disposed between the semiconductor substrate and the high-concentration region;

the high-concentration regions and the low-concentration regions each include a second conductivity type impurity; and an impurity concentration in the high-concentration regions is higher than an impurity concentration in the low-concentration regions.

15. The semiconductor device according to claim 14, wherein
each pair of the high-concentration region and the low-concentration region have an identical outline as viewed in the direction normal to the principal surface.

16. The semiconductor device according to claim 11, wherein
the edge termination region includes a guard ring subregion having the second conductivity type and disposed in contact with the first electrode, and a floating subregion having the second conductivity type and disposed out of contact with the guard ring subregion, the floating subregion enclosing the guard ring subregion as viewed in the direction normal to the principal surface.

17. The semiconductor device according to claim 14, wherein
the impurity concentration in a direction of depth of the low-concentration regions has a profile including an upward curve.

18. The semiconductor device according to claim 17, wherein
the impurity concentration in the high-concentration regions is not less than $1\times10^{19}$ cm$^{-3}$ and the impurity concentration in the low-concentration regions is less than $1\times10^{19}$ cm$^{-3}$.

19. The semiconductor device according to claim 17, wherein
the impurity concentration in the high-concentration regions is not less than $1\times10^{20}$ cm$^{-3}$ and the impurity concentration in the low-concentration regions is less than $1\times10^{20}$ cm$^{-3}$.

20. The semiconductor device according to claim 11, wherein
the first electrode includes a metal selected from the group consisting of Ti, Ni and Mo.

\* \* \* \* \*